United States Patent [19]

Kamisuki et al.

[11] Patent Number: 5,259,737
[45] Date of Patent: Nov. 9, 1993

[54] MICROPUMP WITH VALVE STRUCTURE

[75] Inventors: Shinichi Kamisuki; Yasuto Nose; Nobuo Shimizu; Shinichi Yotsuya, all of Suwa, Japan

[73] Assignee: Seiko Epson Corporation, Tokyo, Japan

[21] Appl. No.: 724,697

[22] Filed: Jul. 2, 1991

[30] Foreign Application Priority Data

| Jul. 2, 1990 | [JP] | Japan | 2-175060 |
| Jul. 6, 1990 | [JP] | Japan | 2-178708 |
| Jul. 6, 1990 | [JP] | Japan | 2-178709 |
| Jul. 6, 1990 | [JP] | Japan | 2-178710 |
| Jul. 6, 1990 | [JP] | Japan | 2-178713 |
| Sep. 17, 1990 | [JP] | Japan | 2-246527 |
| Sep. 21, 1990 | [JP] | Japan | 2-252265 |
| Oct. 12, 1990 | [JP] | Japan | 2-273635 |

[51] Int. Cl.⁵ .................................. F04B 35/04
[52] U.S. Cl. .......................... 417/322; 417/413 R
[58] Field of Search ................. 417/322, 413, 412

[56] References Cited

U.S. PATENT DOCUMENTS

| 4,649,886 | 3/1987 | Igashira et al. | 123/498 |
| 5,085,562 | 2/1992 | van Lintel | 417/322 |

FOREIGN PATENT DOCUMENTS

| 0435653 | 7/1991 | European Pat. Off. | 417/322 |
| 112678 | 4/1990 | Japan . | |
| 9101464 | 2/1991 | World Int. Prop. O. | 417/413 |

Primary Examiner—Richard A. Bertsch
Assistant Examiner—Charles G. Freay
Attorney, Agent, or Firm—Harold T. Tsiang

[57] ABSTRACT

A micropump for pumping liquid from an entry channel to an exit channel is disclosed. The micropump is formed in a semiconductor substrate sealed by two glass substrates. The micropump includes first and second chambers and flow channel means coupled between the two chambers. The micropump also includes a valve coupled between the entry channel and the first chamber. The valve includes a flexible valve membrane positioned closer to a second side of the semiconductor substrate than to its first side for causing the valve to be or not to be in contact with the second side of the semiconductor substrate for closing or opening the valve on the glass substrate. Additionally, the micropump includes a diaphragm forming part of a flexible wall of the second chamber and positioned closer to the second side of the semiconductor substrate than to its first side. The diaphragm is responsive to external pressure for causing liquid to be pumped from the entry channel to the exit channel. Thus, the height of the valve is reduced, preventing deformation due to strength such as its own weight and may impact due to a dropping. As a result, the valve sealing is improve on the glass substrate. Therefore, the micropump can accurately discharge a small quantity of liquid.

22 Claims, 27 Drawing Sheets

MICROPUMP WITH VALVE STRUCTURE

BACKGROUND OF THE PRESENT INVENTION

Field of the Present Invention

The present invention relates generally to extremely small liquid pumps, called "micropumps." It particularly relates to pumps that can precisely control fluid metering in medical treatment and chemical analysis applications, and it relates in particular to silicon technology micro-machining methods used in manufacturing the micropumps.

Related, Copending Applications

Three related applications filed by this Applicant are presently pending in the U.S. Patent Office. These applications are incorporated herein as if fully set forth. The copending applications are: Ser. No. 07/599,298, filed Oct. 17, 1990, now abandoned; U.S. Pat. No. 5,171,132, issued to Hajime Miyazaki, et al. on Dec. 15, 1992 and U.S. Pat. No. 5,157,699, issued to Hajime Miyazaki, et al. on Oct. 20, 1992, all of which name Hajime Miyazaki as an inventor and all of which have the same assignor in common with the present invention.

Micro-machining technology is currently being investigated as a technology that could open up new, high-level technologies. Some of the trends involving this technology have been described in a Japanese magazine article, "Silicon Micro Machining Technology". (See, *Nikkei Electronics*, vol. 480, Aug. 21, 1989, pp. 125-155.) One point made in the article is that a micropump can precisely control very small liquid flows. (Id., pp. 135-139.) The potential of such devices are great, because they make exacting medication delivery systems and chemical analyses possible. The production of micro-mechanical micropumps is also described in "Silicon Micro Machining Technology." Semiconductor etching technology and processes can be used to form silicon into micropumps having complex three-dimensional structures (pp. 146-149). An anodic bonding method is used to bind substrates together, enabling the construction of a wide variety of shapes.

Silicon pressure sensors have developed into very practical micro-mechanical devices. The micropump, on the other hand, is not so well developed, and is currently at the trial production stage. Micropumps are not yet being widely offered for practical applications. Micropump production methods are still being developed, and no concensus has yet appeared.

There are a number of techniques available that can be used to drive the diaphragm of a micropump, e.g., two are based on the piezoelectric and electrostatic effects, respectively. Using either of these two effects, the structure of the base units would basically be the same. A silicon substrate is etched on both sides to form a diaphragm and at least one valve. After the silicon substrate has been processed to a point that its three dimensional features are fully formed on both sides, a pair of glass substrates are attached, like a sandwich, one on each side of the silicon substrate. (Below, the "sides" may be referred to as "bottom side" or "top side," this refers only to the orientation of the sides in the drawings, and should not be understood to mean a particular side must be pointed up or down in actual practice.) A complete micropump with flow channels and valves is thereby created after anodic bonding of the glass and silicon substrates together into a single unit.

Without more, the valves in such devices would leak because the valve-to-glass seals are not very tight. To "preloading", or compress, these valve faces to make them seal more tightly, the face of each valve is built up with a "preloading layer". In the prior art, such a preloading layers use silicon dioxide ($SiO_2$), which is typically formed by thermal oxidation of a silicon substrate used for the micropump body. After oxidation, the areas surrounding the valve are etched away to give shape to the valve. The remaining preloading layer on the valve face is taller than the surrounding edges of the silicon substrate, and must be compressed (as was the intention of this addition) in order to seal the micropump at its perimeters.

FIG. 16 shows a cross-section of a prior art diaphragm 4, which is typically formed by etching (e.g., with a 30% KOH solution heated to 60° C.), and then sandwiched between an entry-side glass substrate 2 and an exit-side glass substrate 1, using anodic bonding, thereby forming a diaphragm valve. To prevent reverse flow (such as when a back pressure is applied) it is necessary to preloading diaphragm 4, as above, to enhance its seal.

Prior art production processes are typified by FIG. 17. Diaphragm 4 is formed by using photolithography to create the through holes and other features on each side of silicon substrate 3. The glass bonding surfaces 8 of both glass substrates 2 and valve section 6 all begin at the same elevations, respectively, and without more, no preloading would be available to diaphragm 4. A preloading layer 13 is therefore formed on valve 6 and comprises a preloading layer, as above. Substrates 1 and 2 are then attached using an anodic bonding method. Preloading layer 13 is fabricated by sputtering a silicon dioxide ($SiO_2$) layer about one micron thick through a photomask onto the surface of valve 6. Deposits are made only where contact will be made eventually with glass substrate 2.

"Anisotropic" etching is a special type of etching where the etching rate varies according to the orientation of the crystal plane. It is typically used with a 30% KOH solution heated to 60° C. For example, the etching rate of a (111) surface will be extremely slow, compared to the etching rate of a (100) surface. Such etching can produce very smooth surfaces on both types. These characteristics can be exploited in a number of useful ways.

An ink-jet device that sprays out very small amounts of liquid in precise amounts, is shown in various stages of being fabricated in FIGS. 18A-18F. The device is really a type of micropump. A thermal oxide layer 22 (FIG. 18A) is formed on silicon substrate 21 and is patterned (FIG. 18B) for ink flow channels to be formed later using photolithography and hydrofluoric acid etching. An alkaline solution is used to etch silicon substrate 21 to form ink flow channel 25 (FIG. 18C) having a predetermined depth. Thermal oxidation is then used (FIG. 18D) to form a thermal oxide layer 23 over the entire surface of the flow channel. Thermal oxide layer 23 is then patterned (FIG. 18E) in the same manner to locate a spray-port 24. An alkaline solution is then used to etch spray-port 24 until it is completely opened up (FIG. 18F). The silicon dioxide ($SiO_2$) layer 23, which is also serves as a preloading layer, is very hard and lacks flexibility. As a consequence, a poor seal is formed, and reverse flow leaks are common. In addition, there are limits on how thin the silicon dioxide (SiO₂) layer can be formed. In anodic bonding assembly of the glass, if the silicon dioxide (SiO₂) layer is too thin, the valve itself will bond with the glass surface. That, of course, would seal the valve shut. Therefore, a certain minimum thickness (about one micron) is required, and this can be a source of problems when finer flow controls require reducing the valve preloading.

If a prior art valve has not been used for a long time, it tends to stick, under certain conditions, due to the extended contact with the glass. Prior art valve function has therefore been poor and production yields have been low. Since prior art diaphragms are usually fabricated in the center of the silicon substrate, to get such depth an excessive amount of etching occurs to the valve, since the valve and diaphragm are simultaneously exposed to the same etch. This excess etching to the valve distorts the shape of the valve and that risks once again losing the ability to make a good seal. The photomasks used in preparation of etching have to be designed to compensate and take into account the possibility of deforming the valve. This limits micropump design flexibility.

A preloading layer 13 on the surface of valve 6 is about the only way of to apply a preloading to the diaphragm in the prior art. A silicon substrate with a (100) surface orientation will have a different etching rate depending on the crystal surface. It also means that preloading layer 13 of valve 6 would not be circular in shape, causing it to have a non-uniform contact with the glass substrate, again causing reverse flow problems. Because there is a large surface in contact, the local pressure may not be high enough at any one point on the face seal. And large contact areas increase the probability that foreign matter will get caught in between preloading layer 13 and glass substrates 1 and 2. Adding to these problems, the shadowing effect of photomasks tends to allow more material to be sputtered into the center of photomask openings. If the middle of valve 6 was off-center, a deformation occurs, and a gap would result between preloading layer 13 and glass substrate 2. In such a case, the flow volume from exit port 10 would vary, because the thickness of diaphragm 4 could not be kept consistent. The prior art also suffers from variations in the amount the diaphragm deforms, in response to a driving source. This results in a problem with fluctuating flow volumes. For the device of FIG. 18E, ink channel 25 has already been formed on silicon substrate 21. The depth of the ink channel runs about several tens of microns. It is very difficult to apply a photoresist (not shown) uniformly to silicon substrate 21 when it has such deep channels. In particular, because the photoresist layer on protruding section 26 is very thin, the thermal oxide layer is undercut slightly by the hydrofluoric acid etching. The top of ink flow channel 25 is over etched, making it hard to get the specified shape. In corners 27, photoresist collects and becomes very thick, about 100-200 microns. This results in very poor pattern accuracy, and ultimately leads to nozzle 24 being deformed. These problems have appeared when producing just about any micropump or pressure sensor that etches silicon to a few hundred microns using alkaline anisotropic etching.

SUMMARY OF THE PRESENT INVENTION

An object of the present invention is to make a micropump and describe a production method for that pump in which the diaphragm valve preloading layer is highly accurate and allows for precise and predictable preloading pressures on the diaphragm.

Another objective of the present invention is to have a valve shape and structure that does not stick during long periods of non-use.

A micropump, according to an embodiment of the present invention, uses wet anisotropic etching to fabricate a flow channel, a valve, and a valve membrane on a silicon substrate. The substrate is then sandwiched between two glass substrates. The diaphragm and valve membrane are closer to one surface than the other of the silicon substrate.

Another embodiment of the present invention is a method of manufacturing a micropump, comprising a first etching of a first side of a silicon substrate to partially form a first side of a valve and a first side of a diaphragm; and a second etching of both said first side and a second side of said silicon substrate, such that said first side of said valve and said first side of said diaphragm are fully formed on said first side of said silicon substrate, and so as to fully form a second side of said valve and a second side of said diaphragm, the depth of etching on said first sides being greater than on said second sides.

A production method for a micropump of the present invention comprises fabricating an etching photomask corresponding to the diaphragm and valve membrane on a first side of a (100) oriented silicon substrate, etching both sides of the silicon substrate using a photomask that corresponds to a valve on a second side of the silicon substrate, and etching both sides of the silicon substrate a specified amount using wet anisotropic etching to give shape to the diaphragm, flow channel, valve, and valve membrane.

An advantage of the present invention is that there is less valve deformation due to excessive etching durations and the valve face is more circular. As such, it contacts the glass substrate evenly. Reverse flow, from the exit port to the entry port, is thereby prevented by any back pressure on the valve and the leak resistant quality of the valve is enhanced.

A further advantage of the present invention is that the pattern of the valve can be larger than the conical tip that makes contact with the glass substrate.

A further advantage of the present invention is that, because the valve has a conical tip with a width of 500 microns or less, good resistance to valve leakage is obtained, even if the preloading and back pressure are concentrated on the conical tip.

A further advantage of the present invention is that since the valve contact surface is small, there is a lower probability that any foreign matter can get caught between the valve and the glass substrate.

A further advantage of the present invention is that production methods are made possible where the thicknesses of the diaphragm can be consistently repeated.

A further advantage of the present invention is that a micropump finished as described here will have few deformities, and will be true to the intended design shape. The valve especially will also have a good shape, thanks, in part, to anisotropic etching. The lack of deformities helps make pumping volumes predictable, because they more closely match design volumes. The values obtained in tests were close to design goals, because the amount of anisotropic etching of the one side of the silicon substrate having the channels, valves and pressure chambers was limited. Also, an examination of water leakage (tightness of pump seal) was done by stopping the driving of the piezoelectric flexor in the condition indicated above and applying the predetermined water pressure from the pump supply port. The result was that substantially no water leaked. In addition, an examination of the existence or nonexistence of reverse flow of water was done by applying the predetermined water pressure on the pump nozzle. However, there was substantially no reverse flow. As for the tightness of the seal and the restriction of reverse flow of these micropumps, there was a reduction in the amount of anisotropic etching on the side substrate with valve 35 and there was almost no deformation or insufficiency of valve 35 depend on that because diaphragm 36 of silicon substrate 31 in FIG. 1 was unevenly distributed over to the valve 35 side of silicon substrate 38. An examination of the bubble removal performance of the micropump was done. The method used applied more than the predetermined water pressure on supply port 45 and the formation of bubbles was observed. There was a very good level of bubble removal. There was no case in which bubbles were applied to the valve or to the through-hole in which they could not be eliminated.

BRIEF DESCRIPTION OF THE DRAWINGS

FIG. 7C is different when comparing FIGS. 6A-6D to FIGS. 7A-7D. The views correspond to several of the important stages of fabrication. Note how in FIG. 7D the addition of the lower glass substrate 60 has caused the valves 55 to flex upward under compressive force in order to accommodate the thickness of layer 57a;

DESCRIPTION OF THE PREFERRED EMBODIMENTS

Figure 1A:
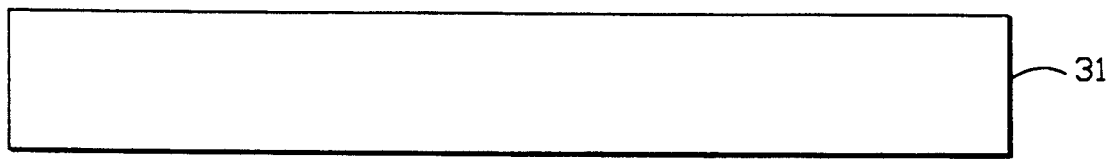
FIGS. 1A-1K are a sequence of cross-sectional views of a substrate taken after several major steps used in fabricating a micropump, according to a first embodiment of the present invention.
Figure 1B:
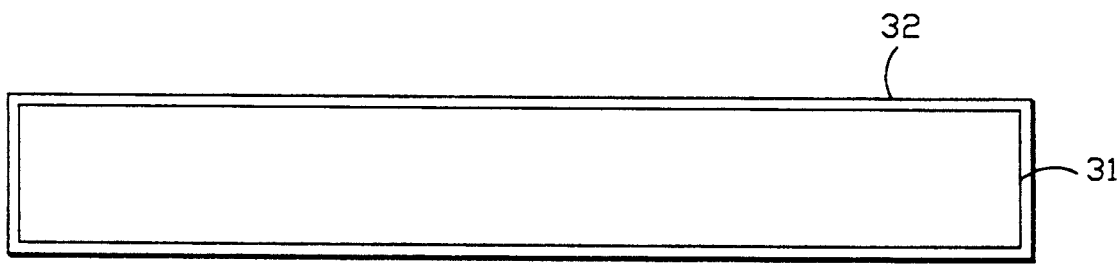
Figure 1C:
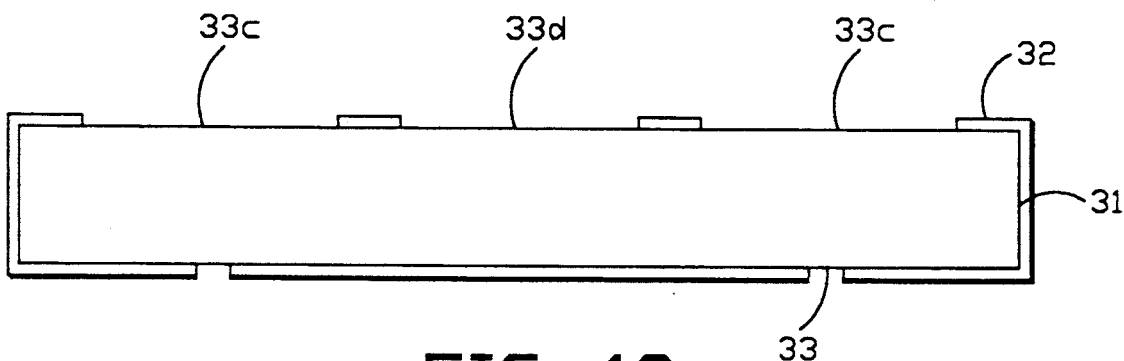
Figure 1D:
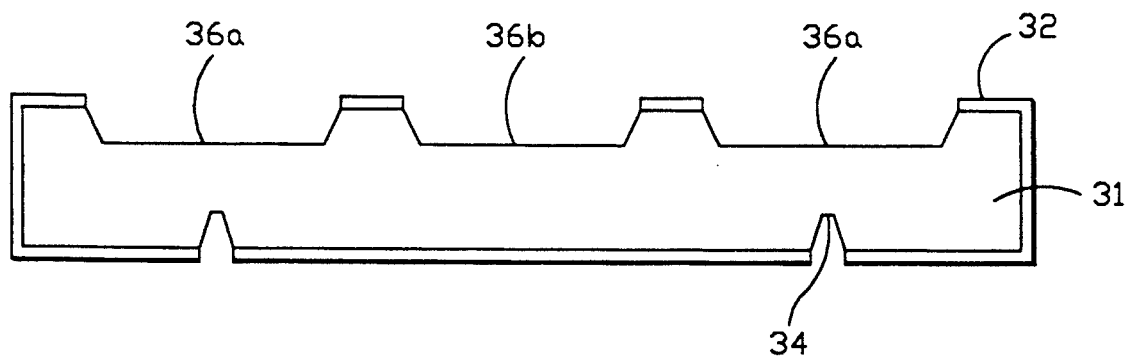
Figure 1E:
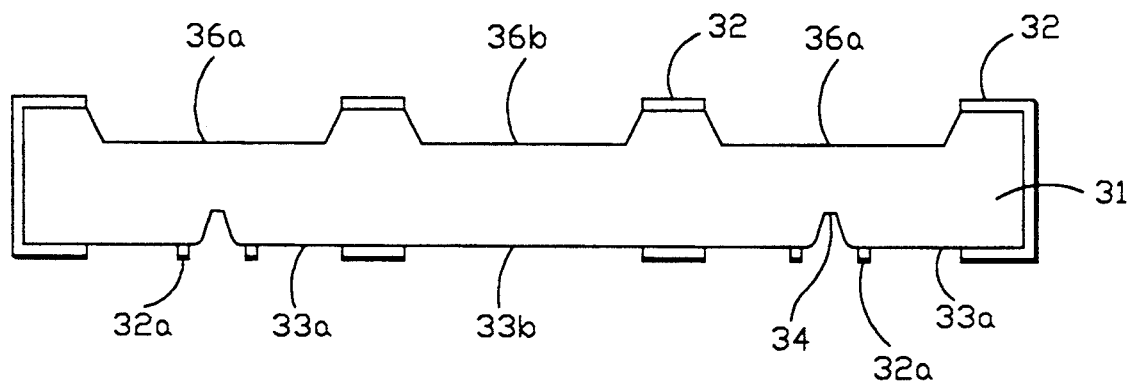
Figure 1F:
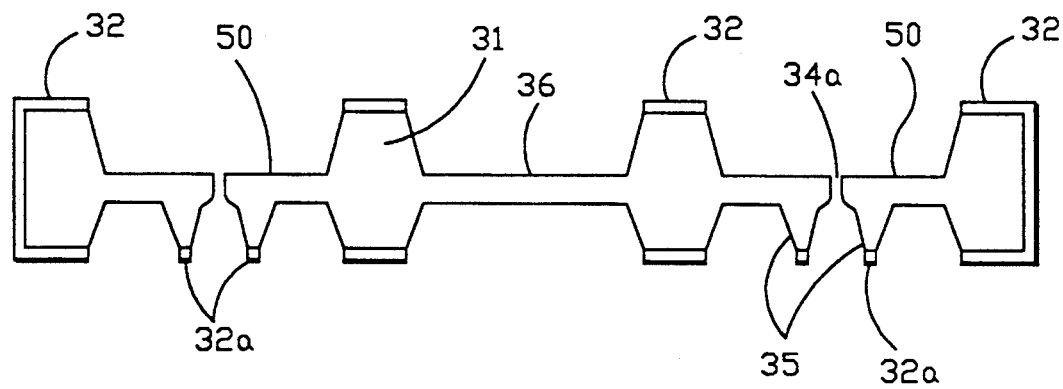
Figure 1G:
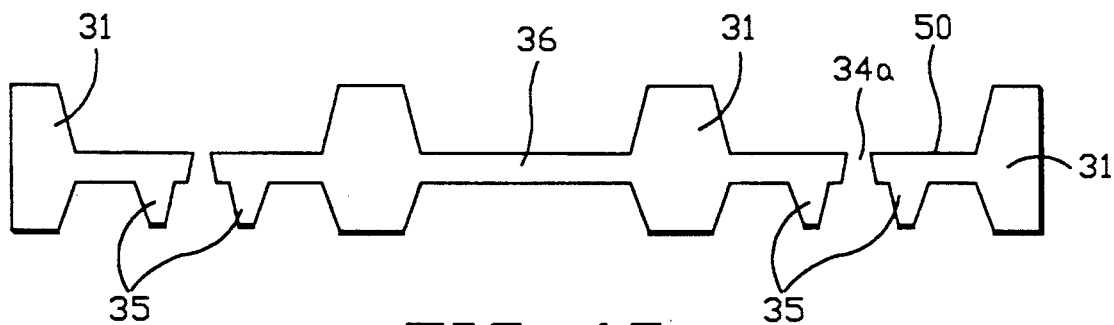
Figure 1H:
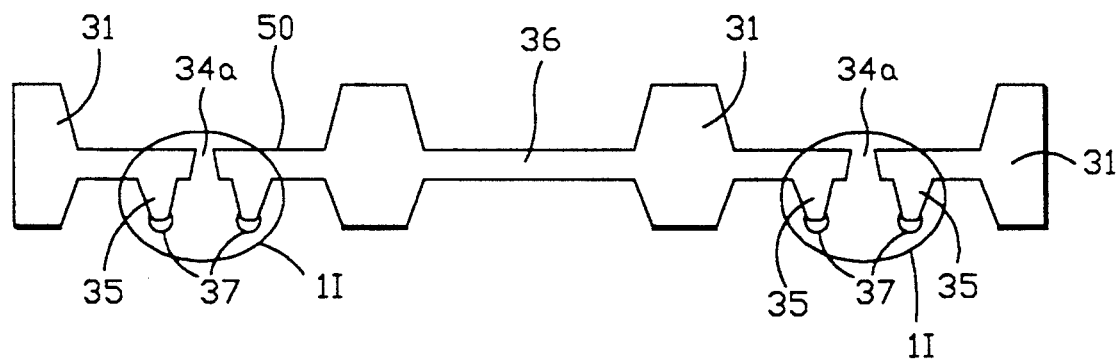
Figure 1I:
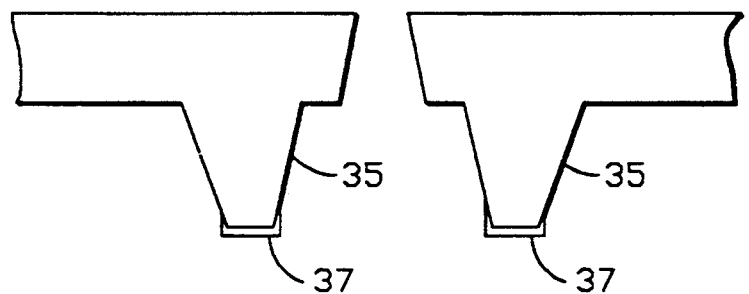
Figure 1J:
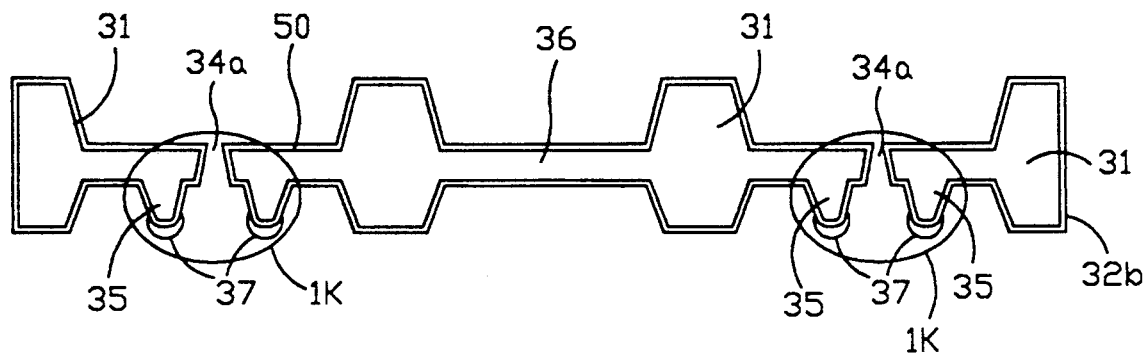
Figure 1K:
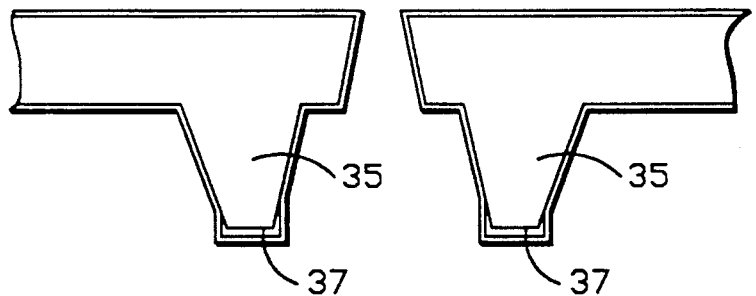

In FIG. 1A, a silicon substrate 31 having a (100) surface orientation, is washed and polished to a thickness of about 280 microns. A one micron oxide film 32 (e.g., silicon dioxide) is formed over the entire surface of this silicon substrate, in FIG. 1B, using a thermal oxidation step. In FIG. 1C, a resist photomask over oxide film 32, top and bottom, and hydrofluoric acid are used to etch any unprotected parts of oxide film 32, e.g., by photolithography. Etching photomasks 33d and 33c are then formed on the top side of substrate 31. These photomasks correspond to a micropump diaphragm and a valve membrane. Then, on the bottom side, a feature 33 is placed, which corresponds to a through-hole that will pass through the substrate 31. (The through-hole acts as a pipe conduit for fluid flow.) Both sides of silicon substrate 31 get a first wet anisotropic etching to form depression 36b (for the diaphragm) to a depth of 60 microns, depression 36a (for the valve membrane), and an incomplete through-hole 34. The etching typically uses a potassium hydroxide (KOH) 30 percent by weight aqueous solution heated to 80° C. In this case, in order to accurately etch a 60 micron depth in silicon substrate 31, the temperature of the etch solution must be closely controlled and frequently stirred. In FIG. 1E, another resist photomask is applied over oxide layer 32 on the bottom side of silicon substrate 31. Hydrofluoric etching then removes any unprotected parts of oxide layer 32, thus forming features 33a and 33b (corresponding to the diaphragm and valve). A second anisotropic etch further shapes the diaphragm and valve from the top and bottom. The bottoms of the valve and diaphragm depressions etch to a depth of 80 microns, and the tops to a depth of 140 microns, from their respective surfaces, after the second anisotropic etching. Diaphragm 36 and valve membrane 50 (surrounding valve 35) take their final forms within the substrate 31. The etching depth for valve 35 will be 80 microns, as opposed to a prior art habit of making the top and bottom etches equal, resulting in a valve etching depth of 110 microns. The shallower, 80 micron depth prevents deformation of the valve and promotes better valve sealing. A hydrofluoric acid solution removes oxide films 32 and 32a (FIG. 1G). In FIG. 1H, silicon dioxide is sputtered through a photomask to form a one micron valve compression layer 37 (See detail of FIG. 11). The entire surface of silicon substrate 31 is oxidized to form a 0.13 micron thick oxidation layer 32 (FIG. 1J). Such an oxide film allow fluids to flow more easily through the micropump to improve the corrosion resistance of the substrate to chemicals that may be used in the fluids being pumped. The process is stopped when holes 34a open up.

Figure 2:
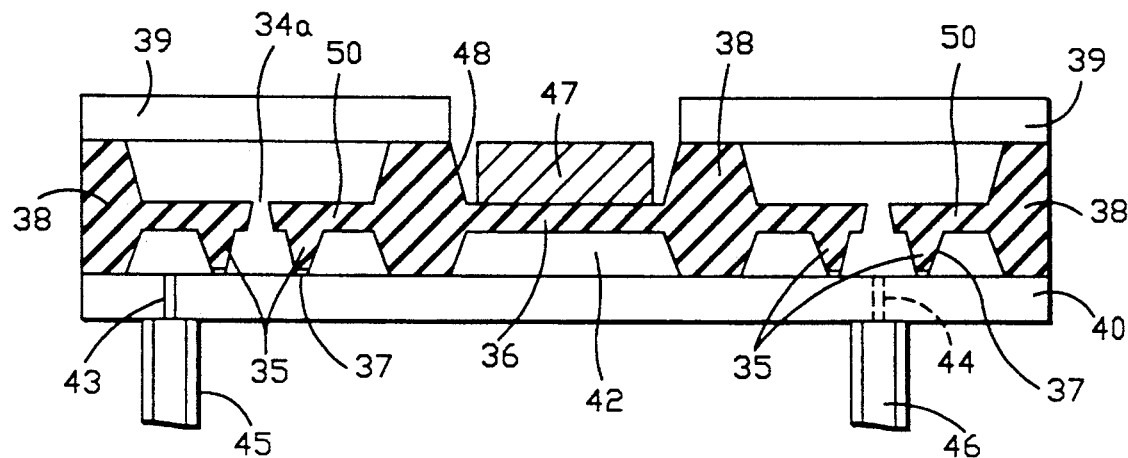
FIG. 2 is a cross-section view of a fully assembled micropump that uses the silicon substrate shown being fabricated in FIGS. 1A-1K, the cross-section is taken along line 2—2 of FIG. 3.

In FIG. 2, a silicon substrate 38 is shown without the thin oxide layer (e.g., layer 32b) for clarity. Diaphragm 36, valve 35, and flow channel 41, are anodic bonded to particular locations in contact with lower glass substrate 40. (An electrode surface for bonding purposes has not been shown in the drawing.) Upper glass substrate 39 (also having an electrode surface not shown in the drawing) is bonded to form a flow channel 41 and a pressure chamber 42. Both the upper and lower glass substrates 39 and 40 comprise one millimeter thick borosilicate glass sheets. Fluid supply port 43 and fluid nozzle 44 are fabricated in the lower glass substrate 40 in advance of assembly with substrate 38. A wide hole 48 accepts a piezoelectric flexer 47 on top of diaphragm 36. When a current is passed through flexer 47, it vibrates, causing the diaphragm it is attached to also move in and out. This causes the valves to operate and fluid will be pumped. An oxide layer 32b is only 0.13 microns thick, and is not so thick as to make anodic bonding impossible. Because valve compression layer 37 is one micron thick, it prohibits anodic bonding. Supply tube 45 connects to supply port 43, while spray tube 46 connects to nozzle 44. The micropump is completed by electrical wiring to drive flexor 47 and tubing to ports 45 and 46.

Figure 3:
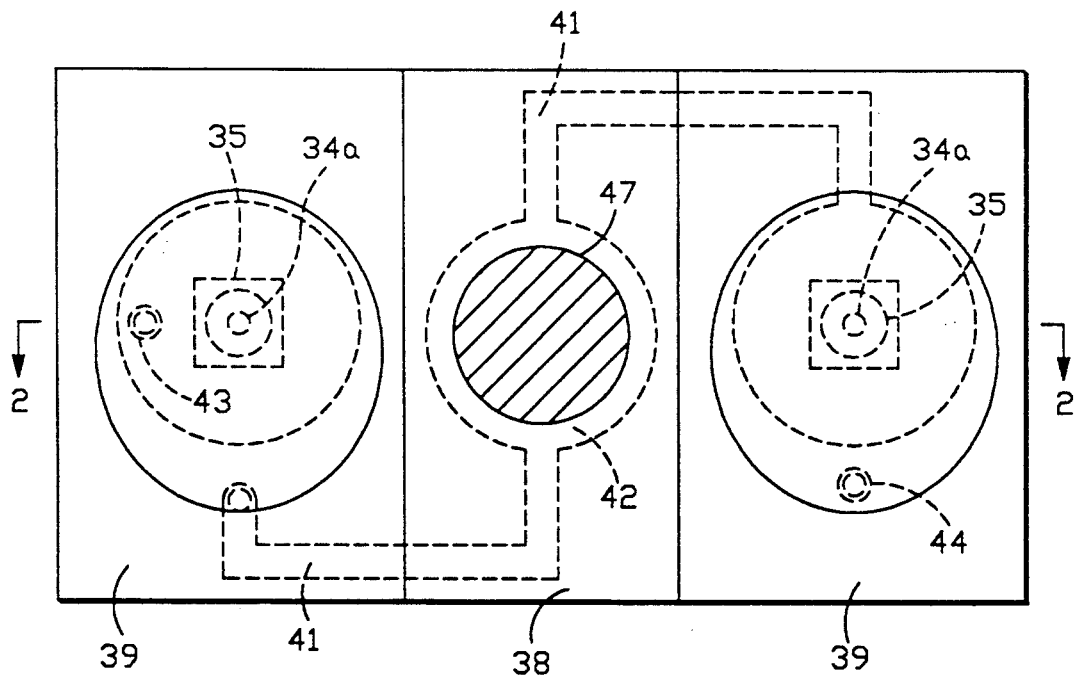
FIG. 3 is a top view of the micropump of FIGS. 1A-1K and 2, and is representative of the other micropump embodiments described here.
Figure 4A:
FIGS. 4A-4M are a sequence of cross-sectional views of a substrate taken after each major step in fabricating a micropump, according to a second embodiment of the present invention.
Figure 4B:
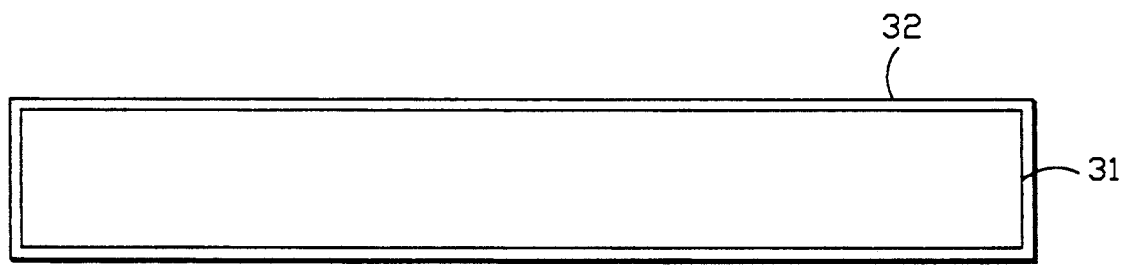
Figure 4C:
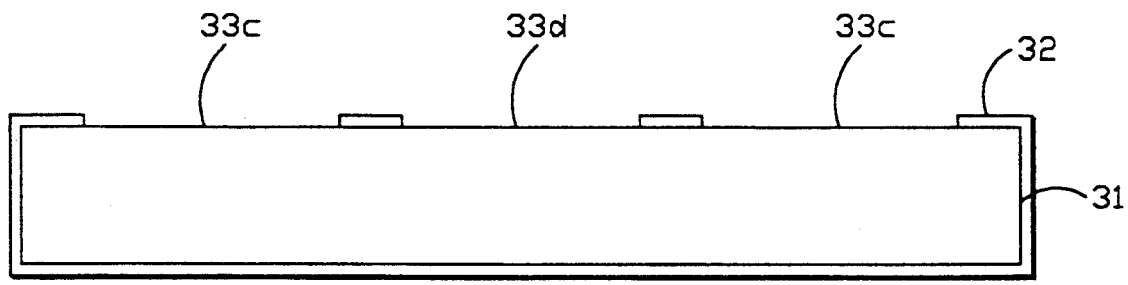
Figure 4D:
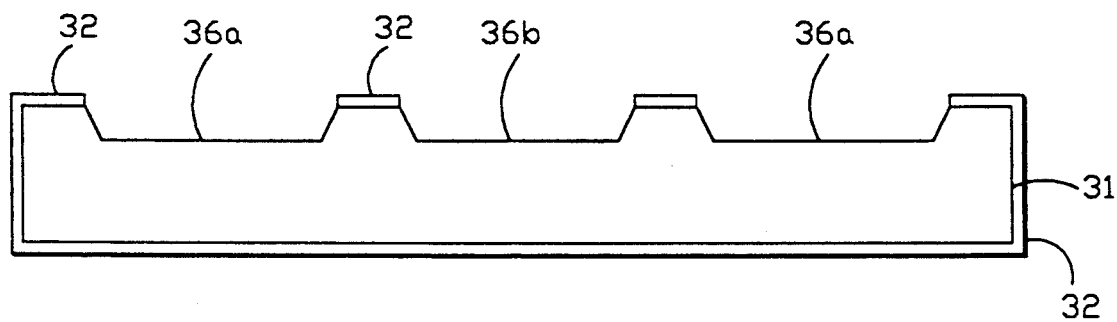
Figure 4E:
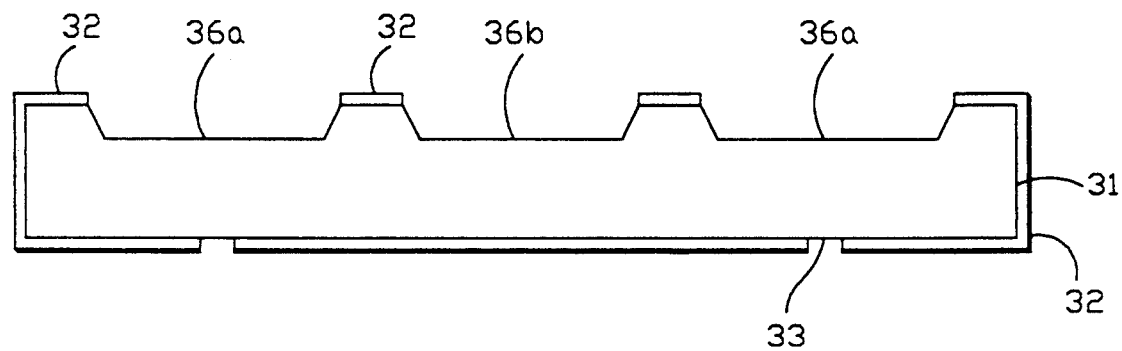

FIGS. 4A–4M have element designations that are basically the same as those used in FIGS. 1-3. In FIG. 4A, both sides of a (100) surface orientation substrate, 280 microns thick, are polished and washed. A one micron oxide layer 32 is formed over the entire surface of silicon substrate 31 using thermal oxidation, as illustrated in FIG. 4B. Next, a resist photomask is used on both sides of oxide layer 32, as shown in FIG. 4C. The unprotected parts of the oxide layer are removed with hydrofluoric acid, thus forming photomasks 33d and 33c, which will eventually become a diaphragm and a valve membrane, on the same side of silicon substrate 31. In FIG. 4D, a first wet anisotropic etching forms diaphragm depression 36b and valve membrane depressions 36a. Each depression has a depth of about 60 microns. The etching is done with a potassium hydroxide (KOH) 30 percent by weight aqueous solution heated to 80° C. In order to accurately etch to a depth of 60 microns, the etching solution is preferably temperature controlled and kept thoroughly mixed by stirring. Resist photomask of the opposite side of substrate 31, and oxide layer 32 of the pattern portion is removed using hydrofluoric acid etching. This forms feature 33 which locates the through-holes.

Figure 4F:
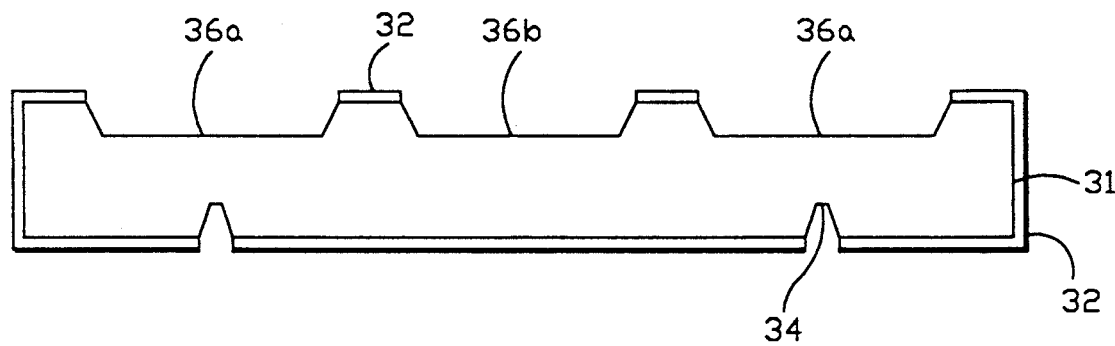
Figure 4G:
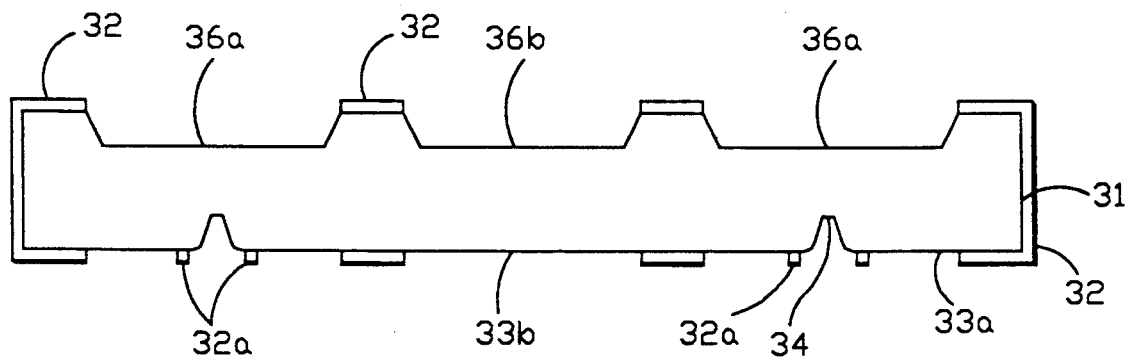
Figure 4H:
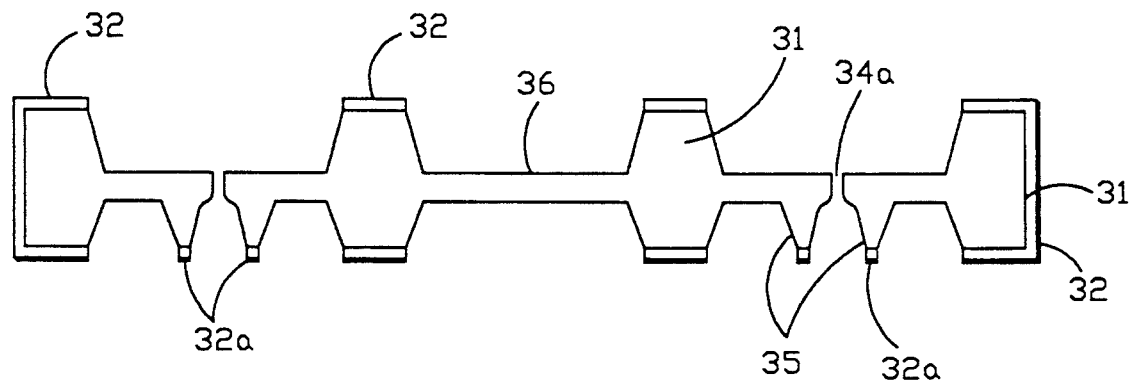
Figure 4I:
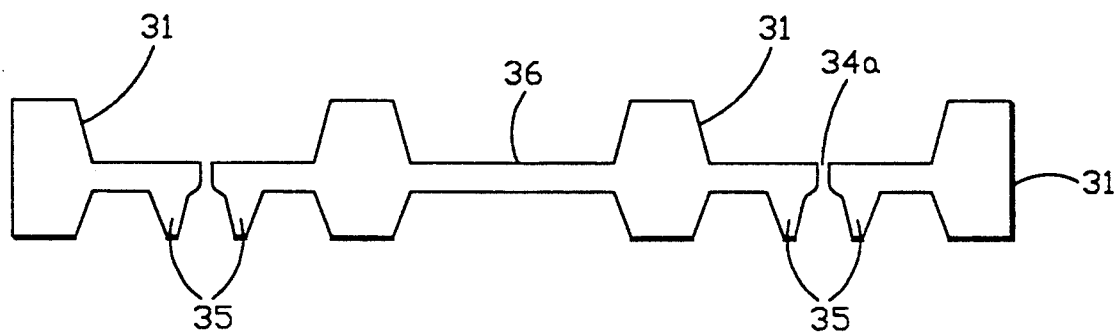
Figure 4J:
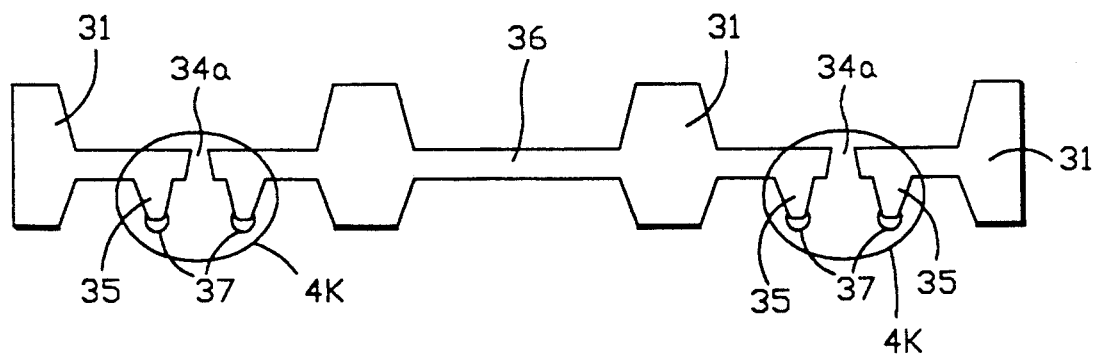
Figure 4K:
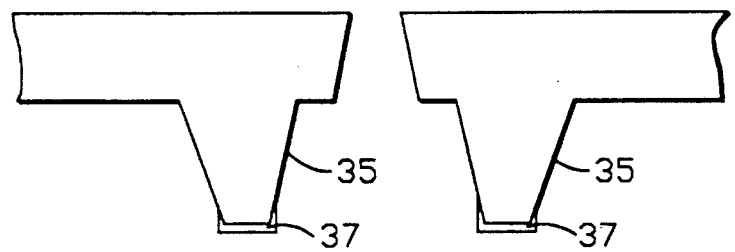
Figure 4L:
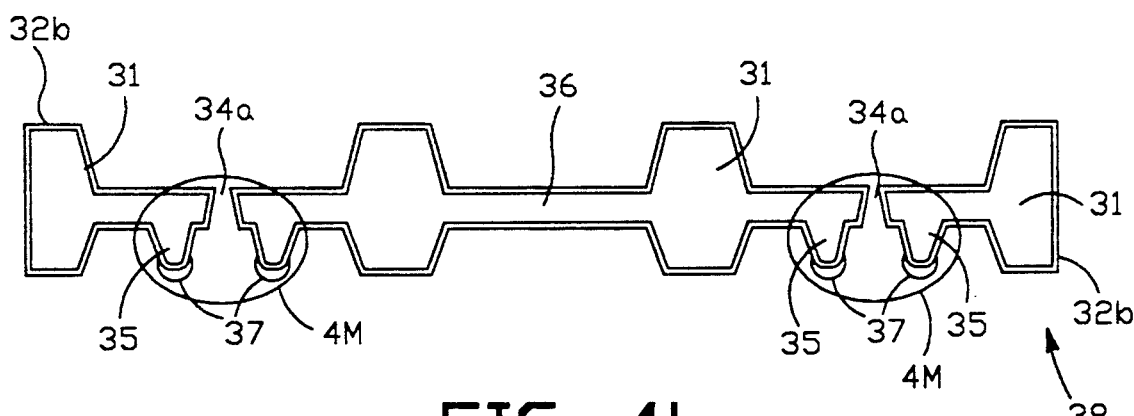
Figure 4M:
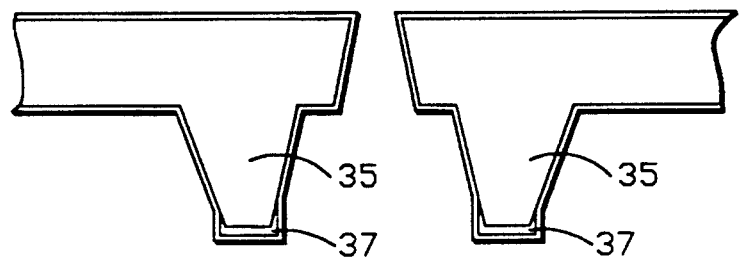

A second anisotropic etching of both sides of silicon substrate 31 forms an incomplete hole 34 to a depth of 60 microns (FIG. 4F). Simultaneously, diaphragm depression 36b and valve membrane depressions 36a, on the top side of silicon substrate 31, have each grown to a depth of 120 microns. Part of oxide layer 32, not protected by a photomask, is removed by hydrofluoric acid etch. This forms feature 33b and 33a, which correspond to the diaphragm and valve (FIG. 4G). Another anisotropic etching step forms the diaphragm and valve features at a depth of about 50 microns from the bottom side (FIG. 4H). Therefore, diaphragm depression 36b and valve membrane depression 36a grow to a depth of 170 microns and hole 34a punches through silicon substrate 31. Oxide layer 32 and 32a are thereafter selectively removed with a hydrofluoric acid solution (FIG. 4I). By allowing diaphragm 36 to be offset and lower in substrate 31, the anisotropic etching needed to form valve 35 is only 50 microns, so there will be substantially no deformation or deficiency in valve 35. This improves the valve seal performance. Next, a one micron thick valve compression layer 37 is sputtered onto valve 35. This also prevents valve 35 from bonding with the glass in the later anodic bonding step. A thermal oxidation over all of silicon substrate 31 forms a 0.13 micron thick oxidation layer 32 (FIG. 4L). This allows fluids to flow through the micropump more easily. It also improves the ability of the surface of the substrate to withstand the corrosive effects of many chemicals found in the fluids being pumped. The final assembly of the micropump is the same as that described above, for the embodiments shown in FIGS. 2 and 3.

Figure 5A:
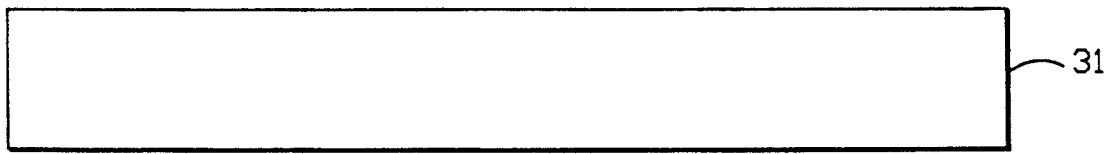
FIGS. 5A-5N are a sequence of cross-sectional views of a micropump body at several of the important stages of a production method that is a third embodiment of the present invention.
Figure 5B:
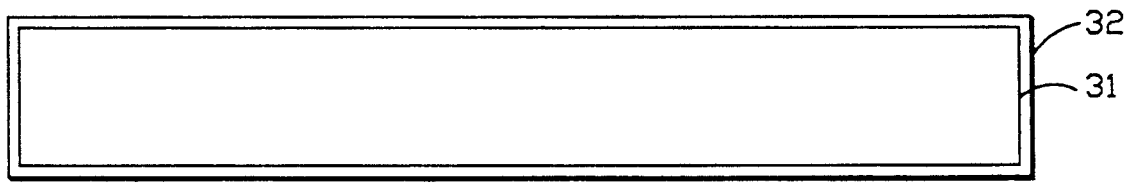
Figure 5C:
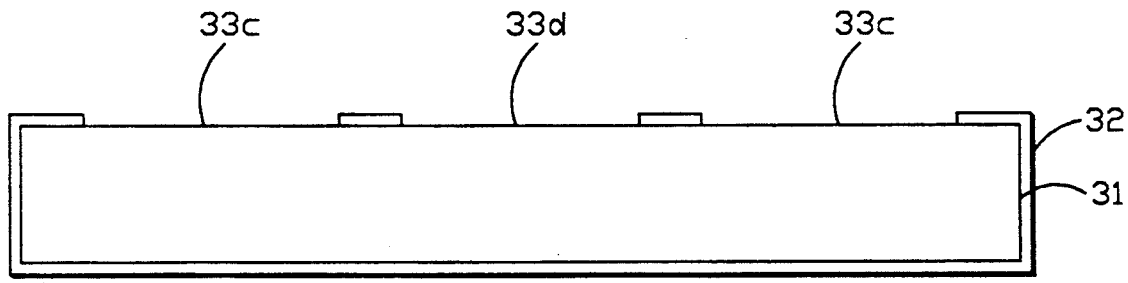
Figure 5D:
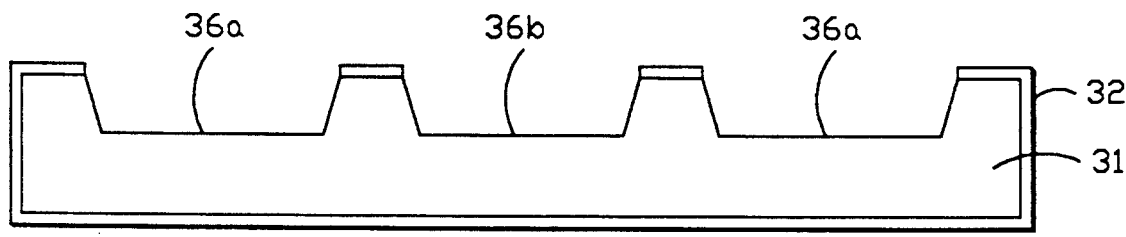
Figure 5E:
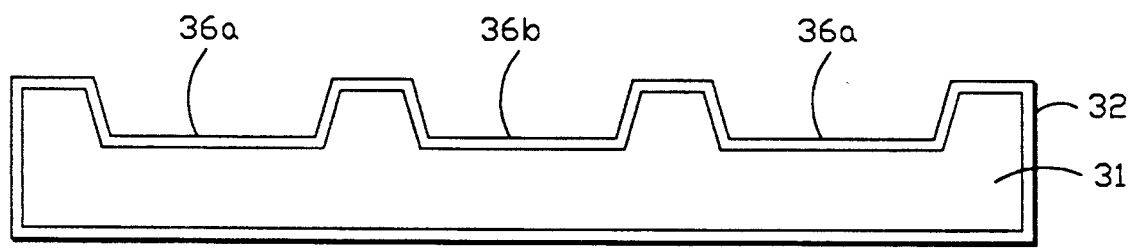
Figure 5F:
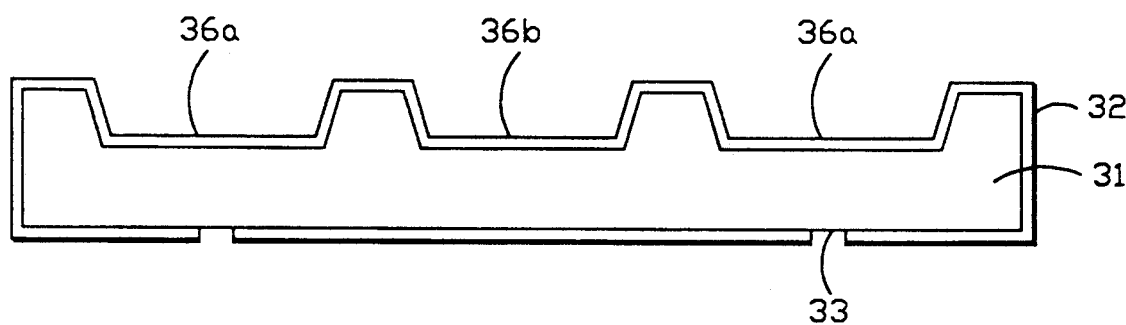
Figure 5G:
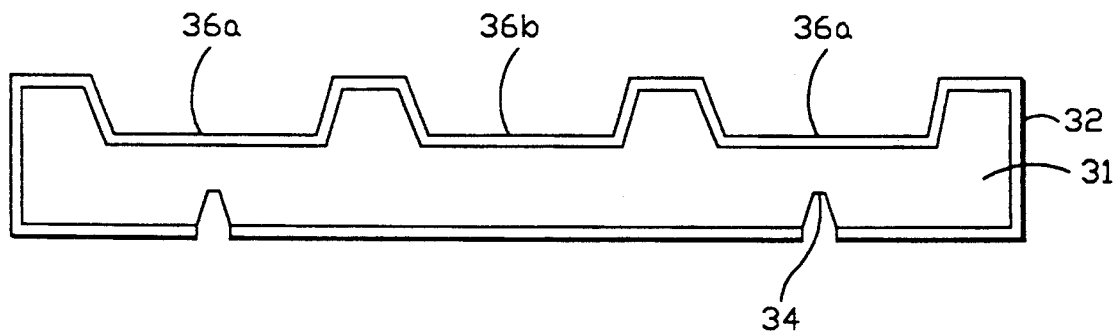
Figure 5H:
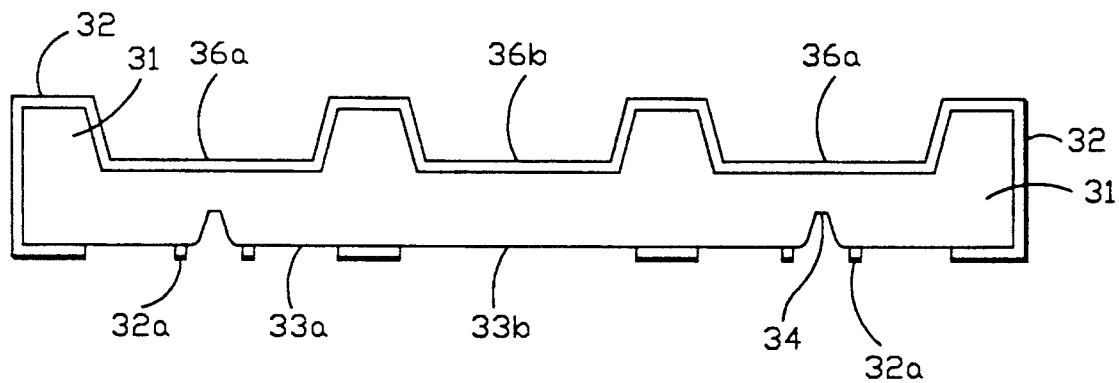
Figure 5I:
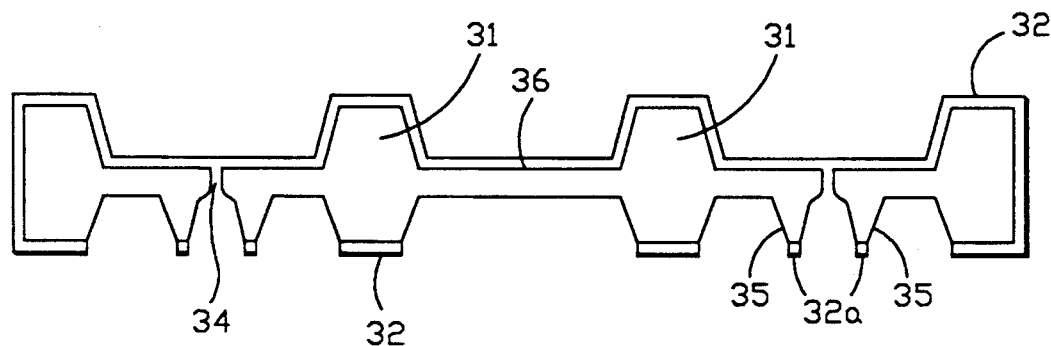
Figure 5J:
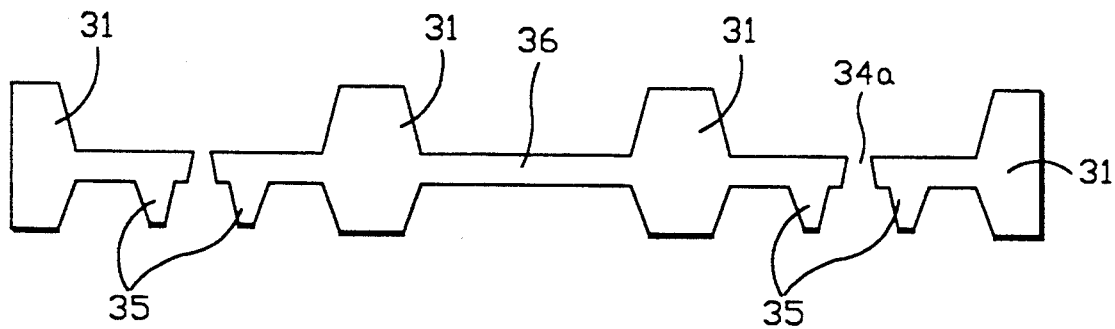
Figure 5K:
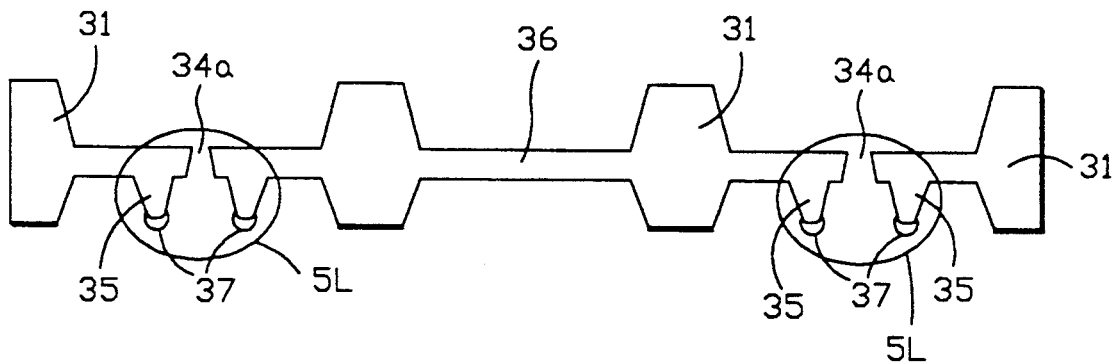
Figure 5L:
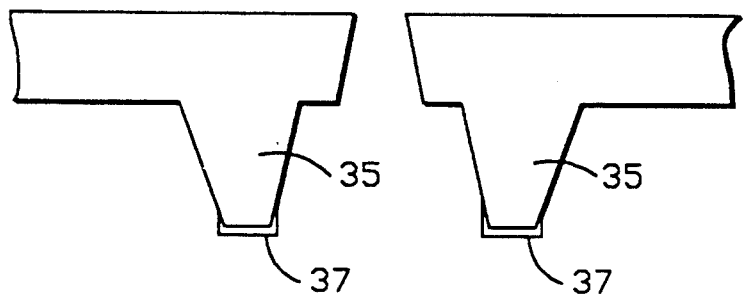
Figure 5M:
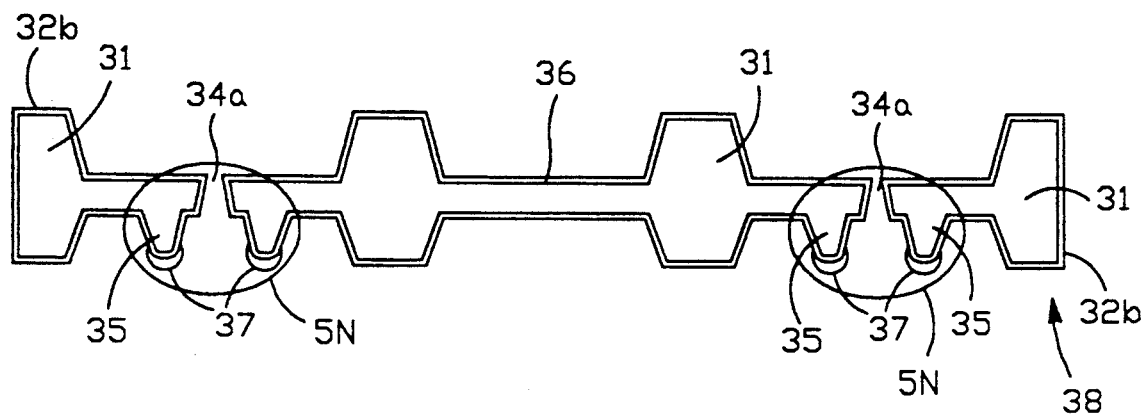
Figure 5N:
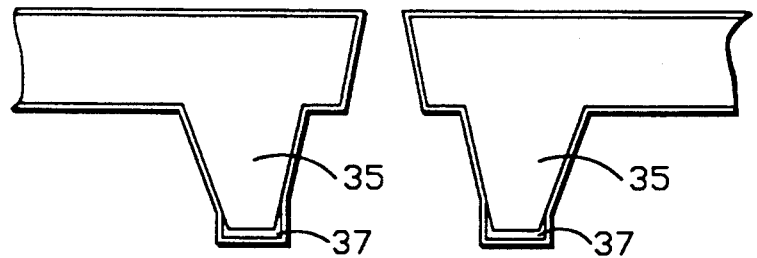

In FIG. 5A, both sides of a (100) surface orientation substrate 31, which is 280 microns thick, are polished and washed. A one micron oxide layer 32 (e.g., silicon dioxide) is formed over the whole surface of silicon substrate 31, using a thermal oxidation method (FIG. 5B). Next, a resist pattern is laid down on the top side of oxide layer 32 (FIG. 5C), and the unprotected parts of oxide layer 32 are removed with hydrofluoric acid. Photomasks 33d and 33c are used to form a diaphragm and a valve membrane. Next, a first anisotropic etching forms depression 36b for the diaphragm, and depression 36a for the valve membrane. Both have a depth of 190 microns (FIG. 5D). Such etching is typically done with a potassium hydroxide solution, 30 percent by weight at 80° C. To accurately etch to a depth of 190 microns, the temperature of the etching solution is controlled and well mixed by constant stirring. Silicon substrate 31 is then coated with oxide layer 32 by thermal oxidation (FIG. 5E). Since depressions 36a and 36b only need be covered, the silicon dioxide ($SiO_2$) layer can also be sputtered on. A resist pattern is laid down on the bottom side of substrate 31, and part of oxide layer 32 is etched away using hydrofluoric acid. This forms feature 33, which will ultimately produce through-holes for the valves (FIG. 5F). A second anisotropic etch forms incomplete hole 34 to a depth of 60 microns. This hole is formed on the bottom side of silicon substrate 31 (FIG. 5G). The bottom side of silicon substrate 31 gets another resist pattern. The unprotected parts of oxide layer 32 are removed by a hydrofluoric acid etch. Features 33b and 33a, which respectively correspond to the diaphragm and valve (FIG. 5H). A third anisotropic etch forms the diaphragm and valve at a depth of 30 microns on the bottom surface of silicon substrate 31 (FIG. 5I). Because diaphragm 36 is below center in substrate 31, the anisotropic etch for the valve was only required to be 30 microns deep. There will be substantially no deformation or deficiency in the resulting valve. The valve seal that results is very much improved. For hole 34, because the back of the valve is covered with an oxide layer, there is also no irregularity in the through-hole, and helps eliminate liquids and bubbles. Oxide layer 32 and 32a are removed with a hydrofluoric acid solution to form through-hole 34a (FIG. 5J). Silicon dioxide (SiO2) photomask sputtering forms a one micron thick valve compression layer 37 on valve 35 (FIG. 5K). This prevents the valve 35 from bonding with the glass in the anodic bonding step, below. Thermal oxidation is done, as above, over the entire silicon substrate to get a 0.13 micron thick oxidation layer 32 (FIG. 5L). This allows fluids to flow easily and improves the anti-corrosive properties of the surface of the substrate. In FIG. 5L, a one micron valve compression layer 37 is formed from the oxide layer on valve 35, and is brought to the end. Final assembly is as above.

Figure 6A:
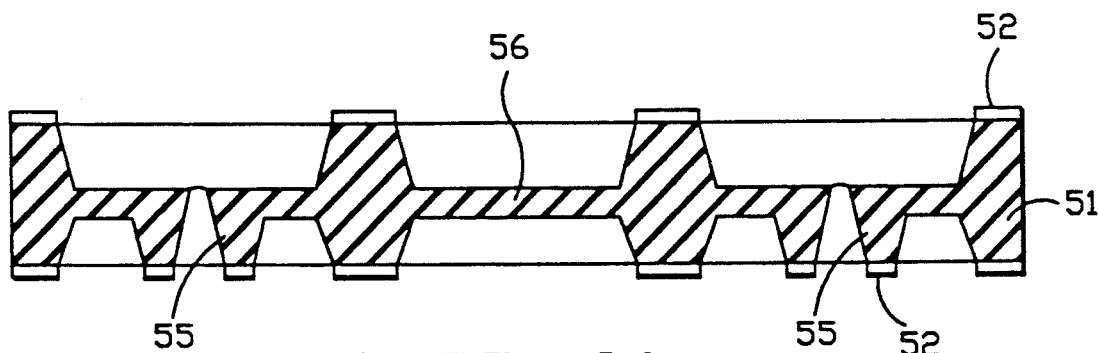
FIGS. 6A-6D are a sequence of cross-sectional views of a fourth embodiment of the present invention, which is a micropump. The views correspond to several of the important stages of fabrication. Note how in FIG. 6D the addition of the lower glass substrate 60 has caused the valves 55 to flex upward under compressive force in order to accommodate the thickness of layer 57.
Figure 6B:
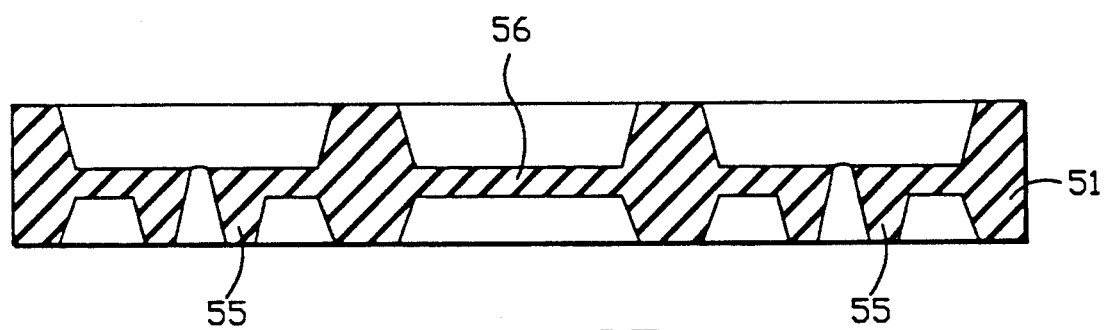
Figure 6C:
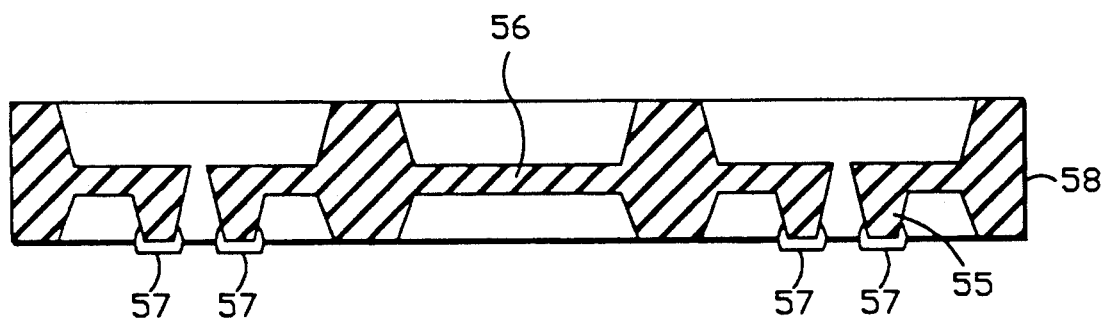

FIG. 6A illustrates a fourth embodiment where a valve 55 and diaphragm 56 are etched from both sides of silicon substrate 51 in a 30% KOH solution heated to 60° C., using a thermal oxide layer 52 (e.g., silicon dioxide) as the photomask. Next, in FIG. 6B, thermal oxide layer 52 is removed using hydrofluoric acid. A polyimide coating is then applied to the tips of the face of valve 55, as illustrated in FIG. 6C, using a screen printing process. It is then cured at 350° C. for 30 minutes to form high-polymer layer 57, which will makes up the preloading section and complete silicon substrate 58.

Figure 6D:
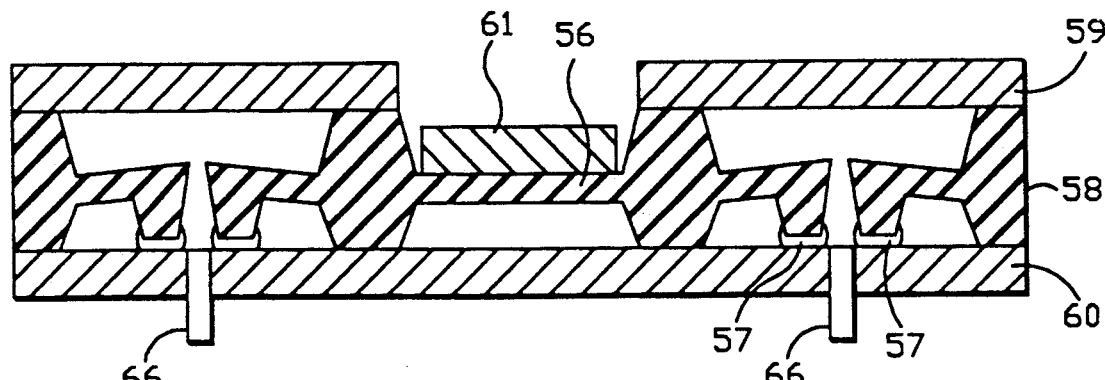

Next, as illustrated in FIG. 6D, upper glass substrate 59 and lower glass substrate 60 are bonded to either side of silicon substrate 58 using anodic bonding (350 degrees C., 0.5 kV). Finally, flexer 61, which drives the diaphragm and drives pipe 66, which allows the fluid to flow in and flow out of the micropump, are attached to complete the micropump.

An examination was made of the micropump fabricated in this manner using the stability of the output volume to compare the degree of seal and the reverse flow conditions with those of the products of the prior art.

When the output volume was measured by driving the micropump at 60 Hz, 50% or more of the products of the prior art became rejects because they did not get the required output volume, which is the rated two microliters ±0.1 per minute. The valve seal was not enough. However, of the 50 micropumps fabricated according to the present invention, only one had to be rejected.

In addition to using polyimide as the high-polymer material of the preloading layer, the same type of trial production uses polyamide as the high-polymer material. It was confirmed that there were no problems in the case of anodic bonding and that a sufficient seal was obtained.

FIG. 7 is the process steps of the cross-section drawing that is the method of fabricating an alternative embodiment of the third micropump of the present invention. FIG. 7D is a cross-section of the micropump configuration.

Figure 7A:
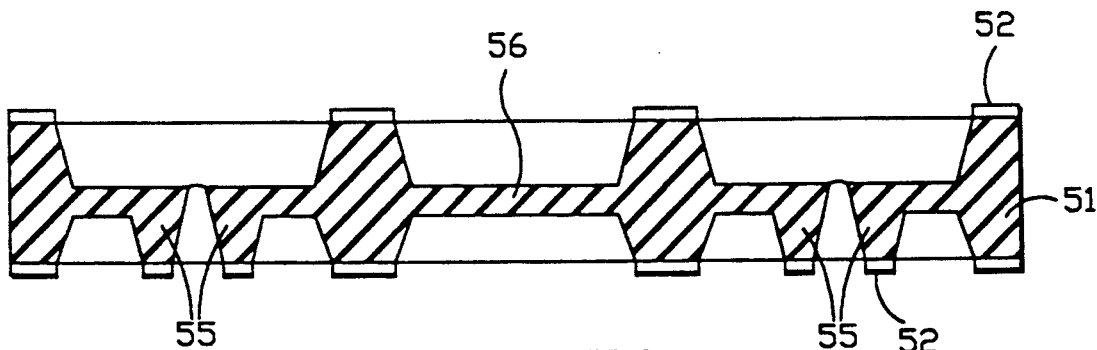
FIGS. 7A-7D are a sequence of cross-sectional views of a fifth embodiment of the present invention, and is a variation of the fourth embodiment. Only
Figure 7B:
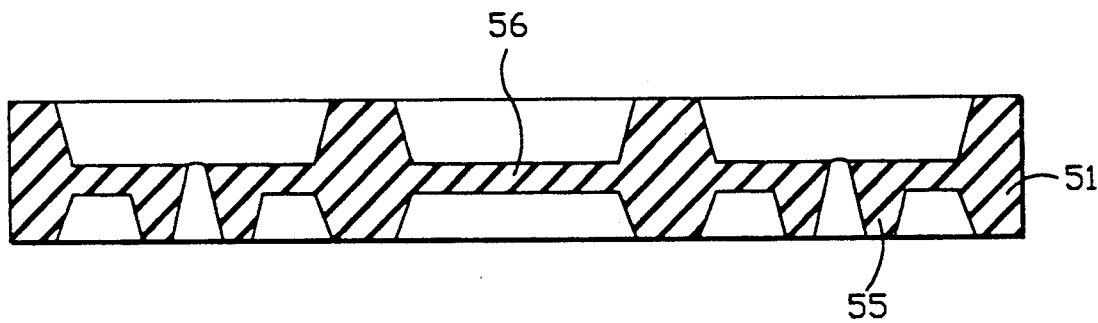
Figure 7C:
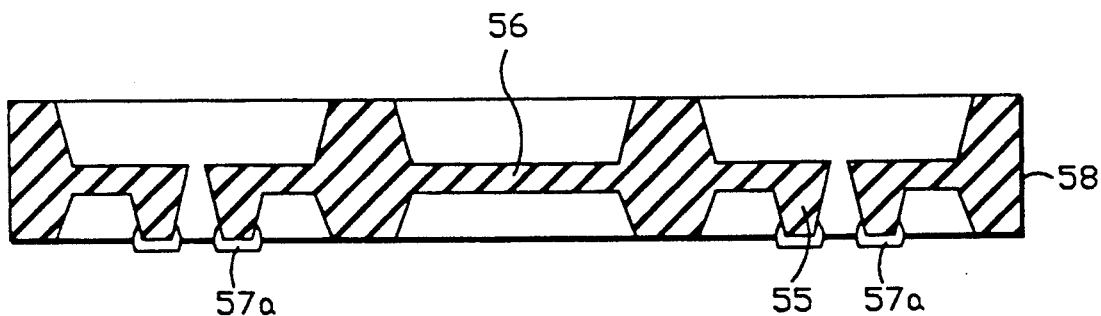
Figure 7D:
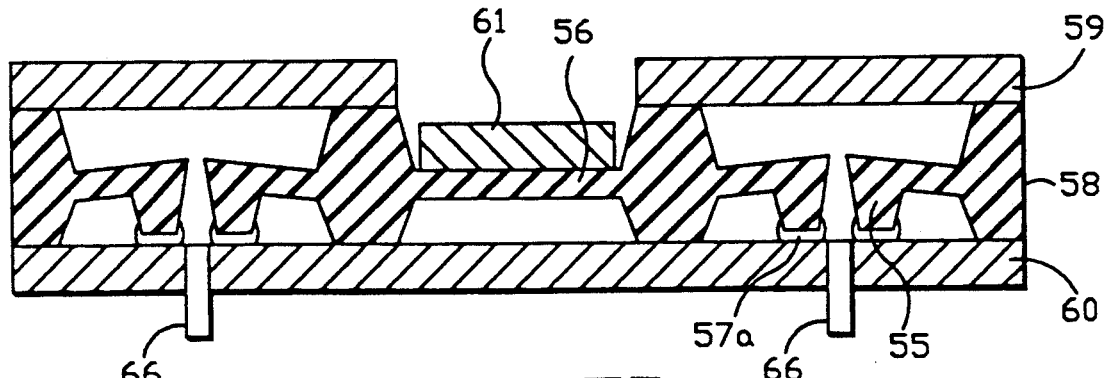

In FIGS. 7A, 7B, and 7D, the content is exactly the same as that described in the embodiment in FIG. 6. Therefore, this description will be omitted. In FIG. 7C, a partial 0.5 micron film of TiN is deposited on the upper surface of valve 55 to form nitride layer 57a by metal plating through a photomask. This layer becomes the preloading layer. However, instead of the TiN described above, the preloading layer may also be formed by depositing AlN or TaN. In the case of an AlN layer, it is desirable to have a film thickness of one microns or less, and the anodic bonding conditions may be increased to 400° C. and 0.8 kV.

When the condition of the valve of a micropump formed in this manner was examined, in the case of the preloading layer of the thermal oxide layer of the prior art, with a film thickness of one microns or less, 10% to 20% of the valves bonded to the glass substrate. By contrast, almost no such bonding was seen with the valves of the present invention.

In the case of a long period of time as well, the sticking of valves after 1,000 hours had elapsed in a 60 degrees C.×90% atmosphere was 30% for valves of the prior art. However, of the 100 micropumps fabricated from the present invention, only one showed the valve sticking problem.

Figure 8A:
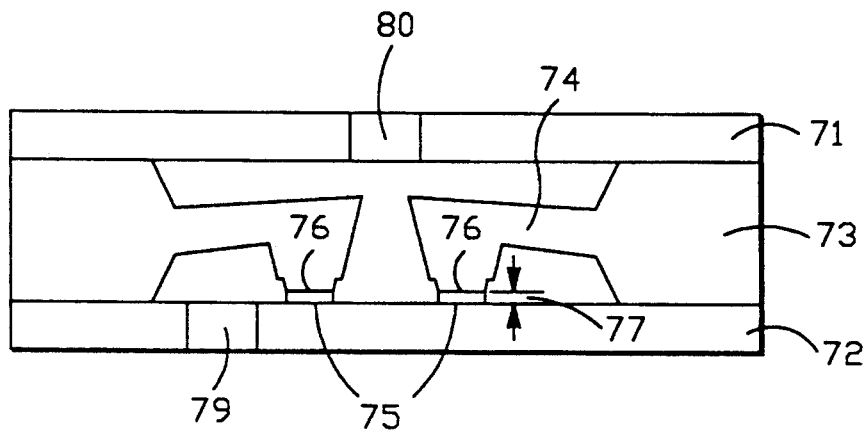
FIG. 8A is a cross-section of the diaphragm valve for a micropump, according to a sixth embodiment of the present invention.
Figure 8B:
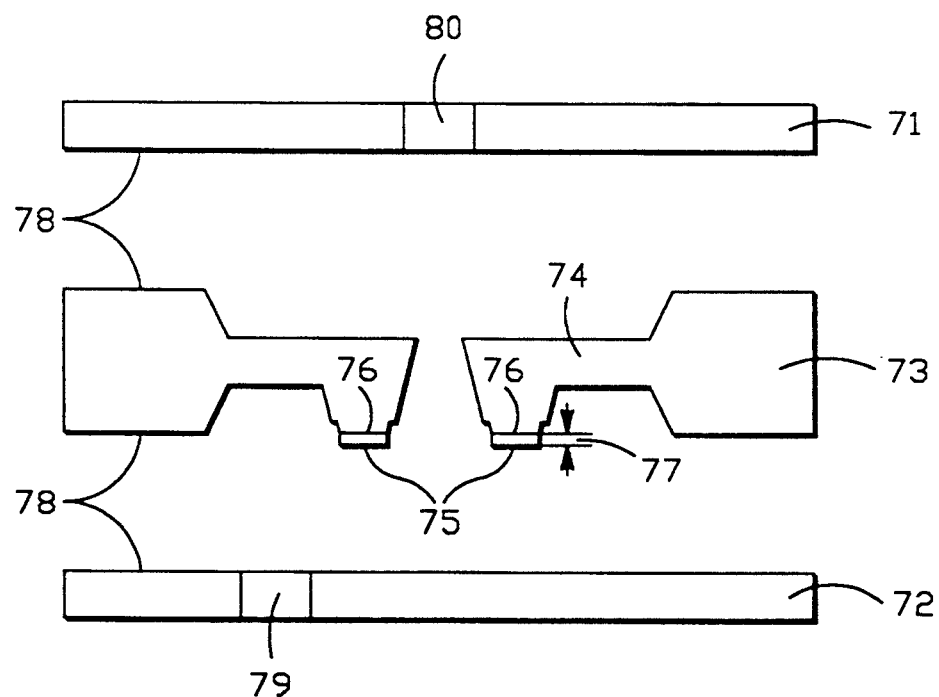
FIG. 8B is an exploded assembly, in cross-section, of the components for the diaphragm valve of FIG. 8A.

FIG. 8A–8B show a step 77 and diaphragm 74 being formed by etching in a 30% KOH solution heated to 60° C. Photolithography and etching are used on both sides of the silicon substrate 73, which is attached to bonding surfaces 78 of the entry-side glass substrate 72 and exit-side glass substrate 71. These are bonded using an anodic bonding method to complete the diaphragm valve. The etching of silicon substrate 73 uses a photomask that was a 1.5 micron thermal oxide film. In this structure, silicon substrate 73 shifts and the width of conical tip 75, which is on valve 76 and makes contact with glass substrate 72, is 200 microns. A spacer with a height of one micron is formed and preloading step 77 is formed. The method of fabricating preloading step 77 is to use photolithography to pattern the shape of conical tip 75 on the silicon dioxide (SiO2) film and etch a one micron thick section of unnecessary silicon dioxide (SiO2) film (not illustrated). Preloading step 77 can be made even higher by continuing to etch the silicon of silicon substrate 73. The silicon dioxide (SiO2) layer is the left over photomask thermal oxide film used to etch silicon substrate 73 or a thermal oxide film that was formed again or a sputtered film. Silicon dioxide (SiO2) formed through thermal CVD has the same effect. The width and height of conical tip 75 of valve 76 quite naturally have the optimum dimension that depend on the thickness of diaphragm 74. Table 1 is the reverse flow results compared to the width and height of the conical tip. The diaphragm thickness is 40 microns and the back pressure is 0.8 m H2O. Based on the results in Table 1, the optimal dimensions are 200 microns for the contact point width and 1-2 microns for its height.

TABLE 1

| Contact Point (RE: FIG. 8) | | |
|---|---|---|
| Width | Height | Reverse Flow Volume |
| 50 μm | 2 μm | 0.03 microliters/minute |
| 100 μm | 2 μm | 0.02 microliters/minute |
| 200 μm | 1 μm | 0.01 microliters/minute |
| 200 μm | 2 μm | 0.01 microliters/minute |

TABLE 1-continued (RE: FIG. 8)

| Contact Point | | |
|---|---|---|
| Width | Height | Reverse Flow Volume |
| 400 μm | 4 μm | 0.04 microliters/minute |

TABLE 2

(PRIOR ART)

| Contact Point | | |
|---|---|---|
| Width | Height | Reverse Flow Volume |
| ~900 μm | 40 μm | 0.02 microliters/minute |

Figure 9A:
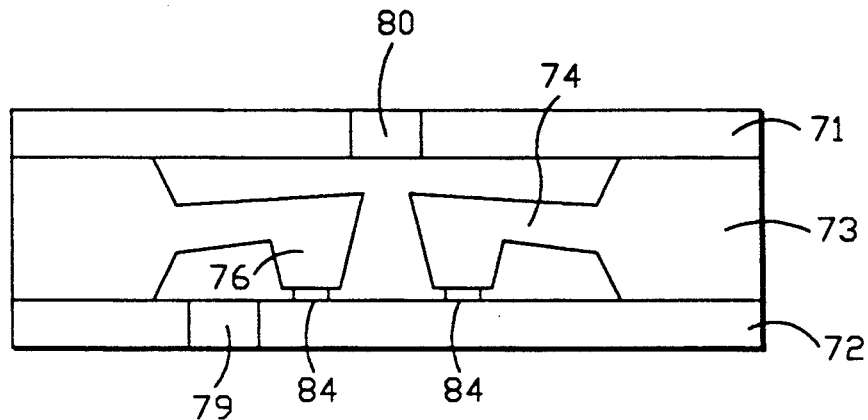
FIG. 9A is a cross-section of the diaphragm valve for use with a micropump, according to a seventh embodiment of the present invention.
Figure 9B:
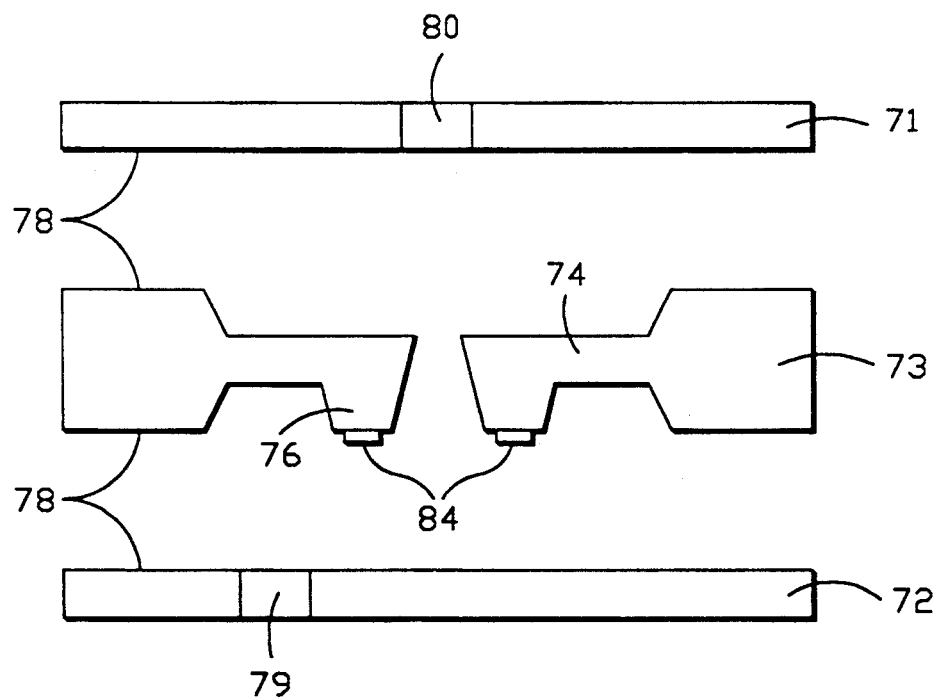
FIG. 9B is an exploded assembly, in cross-section, of the components for the diaphragm valve of FIG. 9A.

In FIG. 9A, a conical tip 84 comprising a high-polymer (e.g., polyimide or polyamide) is formed by photolithography and uses photo-sensitive resins. Preferably, conical tip 84 will have a width of 200 microns and a height of two microns. The optimum dimensions depend on the thickness of diaphragm 74.

Table 3 lists some experiment observations of reverse flow rates versus the width and height of conical tip 84. Table 4 is a comparison with the prior art. The diaphragm thickness is 40 microns and the back pressure is 0.8 m H2O.

TABLE 3

(RE: FIG. 9)

| Contact Point | | |
|---|---|---|
| Width | Height | Reverse Flow Volume |
| 100 μm | 2 μm | 0.04 microliters/minute |
| 200 μm | 1 μm | 0.01 microliters/minute |
| 200 μm | 2 μm | 0.01 microliters/minute |
| 400 μm | 2 μm | 0.01 microliters/minute |
| 500 μm | 4 μm | 0.01 microliters/minute |

TABLE 4

(PRIOR ART)

| Contact Point | | |
|---|---|---|
| Width | Height | Reverse Flow Volume |
| About 900 μm | 40 μm | 0.02 microliters/minute |

Figure 10A:
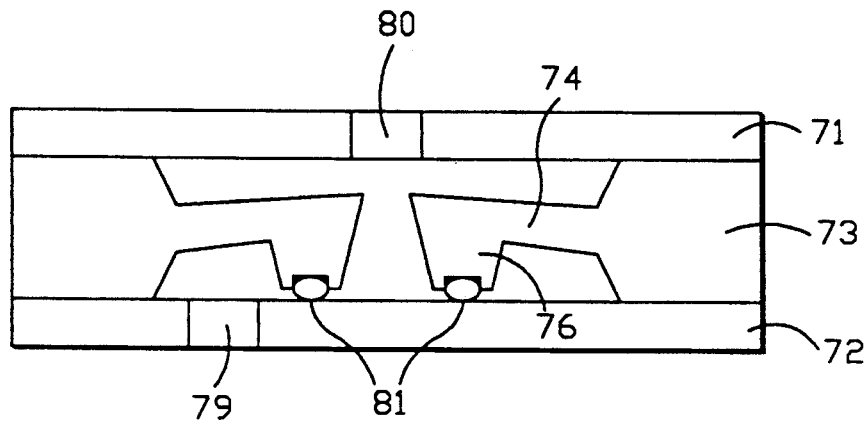
FIG. 10A is a cross-section of the diaphragm valve for use with a micropump, according to an eight embodiment of the present invention.
Figure 10B:
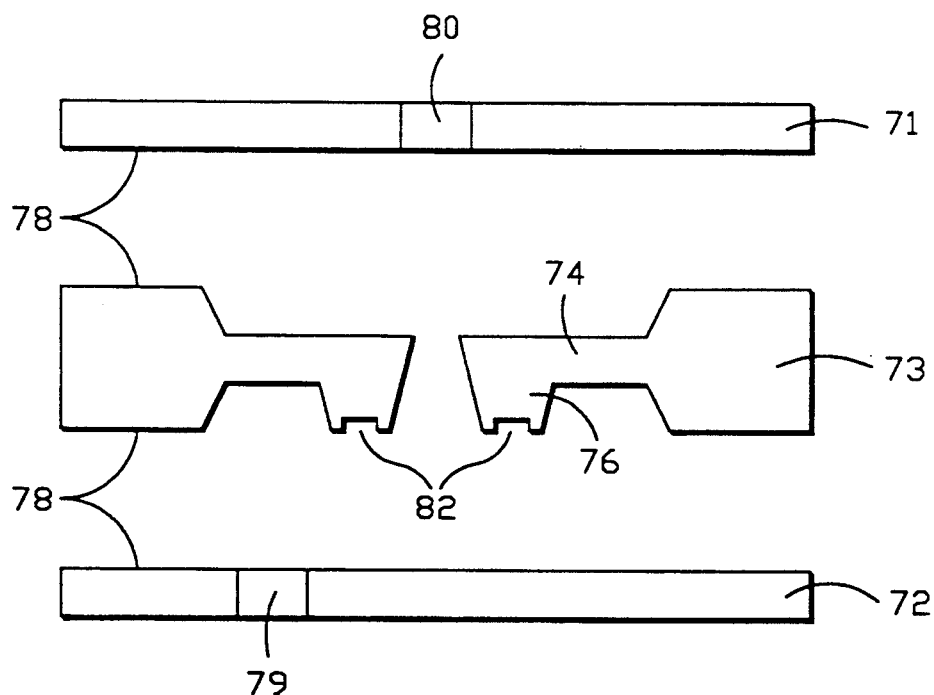
FIG. 10B is an exploded assembly, in cross-section, of the components for the diaphragm valve of FIG. 10A.

The embodiment shown in FIG. 10A is a case in which a part of the conical tip is buried into the silicon substrate in order to improve the strength of the adhesion of the conical tip. FIG. 10A is a drawing of the components that show the structure of another diaphragm valve of this embodiment. FIG. 10B is a cross-section showing the diaphragm valve production method.

The method of fabricating conical tip 81 is to form concentric circle groove 82 on valve 76 of diaphragm 74 and bury spacer ring 81. Spacer ring 81 is formed separately within the groove 82 and is higher than the depth of concentric circle groove 82. Or, the spacer ring may be formed on the substrate using photolithography.

In the embodiment in FIG. 10, spacer ring 81 was formed with a width of 200 microns and a spacer was formed with a height of two microns in a substrate using photolithography. The width and height of conical tip 81 of valve 76 quite naturally have the optimal dimensions depend on the thickness of diaphragm 74. Next, Table 5 is the reverse flow results compared to the width and height of conical tip 84. Table 4 is a comparison with the prior art. The diaphragm thickness is 40 microns and back pressure is 0.8 m H2O.

TABLE 5

| Contact Point | | |
|---|---|---|
| Width | Height | Reverse Flow Volume |
| 100 μm | 2 μm | 0.04 microliters/minute |
| 200 μm | 2 μm | 0.01 microliters/minute |
| 300 μm | 3 μm | 0.01 microliters/minute |
| 500 μm | 4 μm | 0.01 microliters/minute |

As indicated above, by using embodiment 2 and devising a method for the diaphragm valve, it is possible improve the leak resistant characteristics as well as possible to have reliable fabrication. That is, the conical tip can be formed easily and it is possible to prevent the reverse flow caused by back pressure by eliminating the lack of uniform spacer thickness due to photomask sputtering. Reverse flow is also prevented by the conical tip of the valve making uniform contact with the glass substrate. If the valve contact point is made of a flexible high-polymer material, the diaphragm valve will be excellent against leaks, even if there is some slight deformation or foreign matter. When a part of the conical tip was inlaid within the silicon substrate, the strength of the adhesion between the spacer and the silicon substrate improved.

Figure 11A:
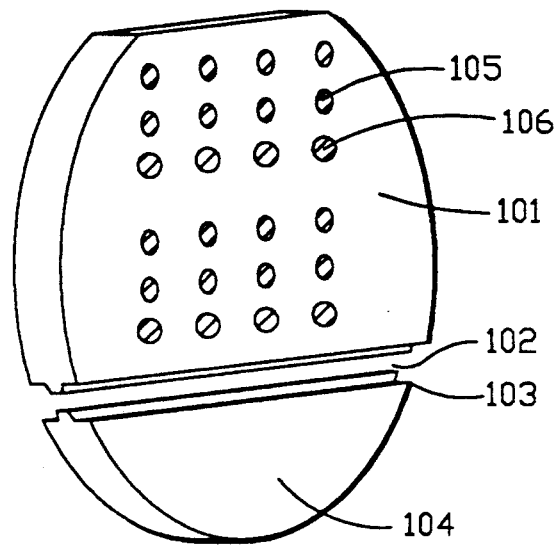
FIG. 11A is a perspective view of an end-of-the-cassette wafer, according to an ninth embodiment of the present invention.
Figure 11B:
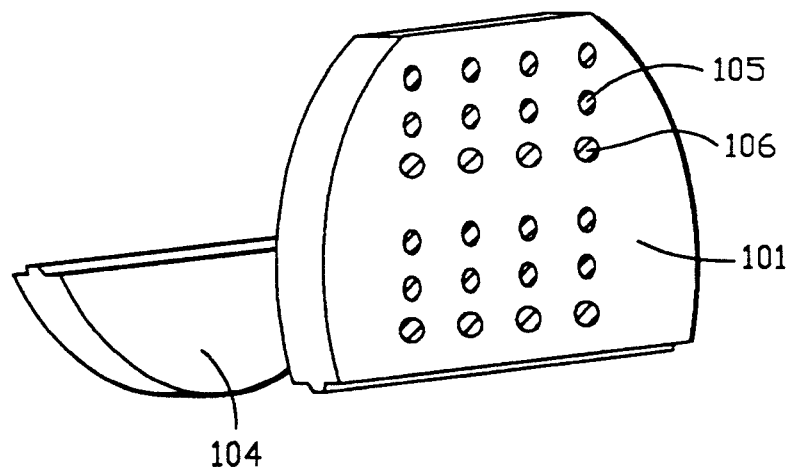
FIG. 11B is a drawing that describes the cutting of the silicon substrate and is the resulting change in position of the end-of-etch detector.

A micropump production method, according to a ninth embodiment of the present invention, is used for precision fabrication and control of the diaphragm. As such, it has an affect on the precision and reproducibility of the micropump fluid displacement. FIG. 11A and 11B illustrate a silicon wafer (substrate) 101 that has several micropump bodies being fabricated on it. Wafer 101 can be the end wafer in a cassette full of wafers. Silicon substrate 101 will separate from substrate 104 along the line of a first end-of-etch detector 102 when etching has progressed far enough. This separation gives a dramatic signal to an operator to stop etching. The Figs. represent the situation that exists the instant etching should be stopped (when the substrate splits into parts 101 and 104).

Figure 12A:
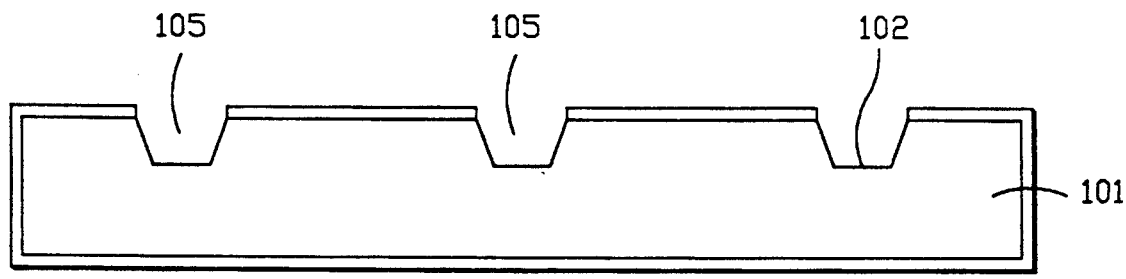
FIGS. 12A-12C are cross-sections of the wafer of FIG. 11A-11B taken at various points in the production method.
Figure 12B:
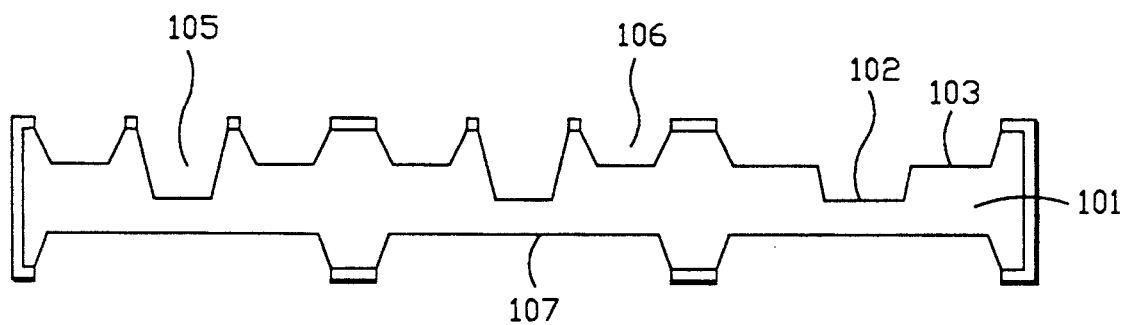
Figure 12C:
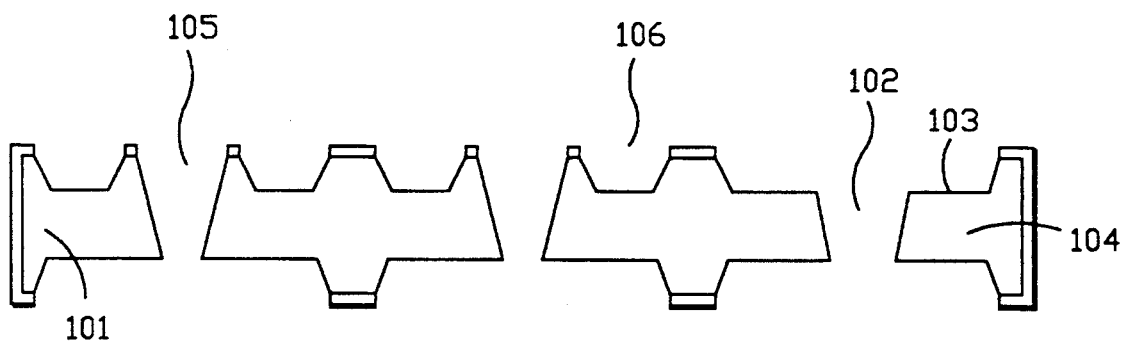

FIGS. 12A-12C show more precisely what is going on in FIGS. 11A-11B. In FIG. 12A, a through-hole 105 and the first end-of-etch detector 102 are formed on a first side of silicon substrate 101. The end-of-etch detector 102 is not a point like through-hole 105, but rather is a straight-line channel that cuts across the silicon substrate and wafer, which has a outside diameter of about three inches and a thickness of about 220 microns. Features 102 and 105 are made by etching in a 30% KOH solution, heated to 60° C., to get the desired diaphragm thickness and an accurate depth of 40 microns. In FIG. 12B, the silicon substrate is then etched further, this time on both top and bottom sides ("top" and "bottom", with respect to the drawing only). Through-hole 105 opens up the same time the first end-of-etch detector 102 cuts through. If several identical wafers 101 are in the same batch, it is enough to control one of the batch.

Diaphragms would vary ±5 microns or more in the prior art. The typical variations observed for the present invention were within the range of ±1 micron. In the ninth embodiment, the second end-of-etch detector 103 was formed on both sides of the silicon substrate. However, depending on the production method, if the bottom side of diaphragm pattern 107 is completed first, the effect is the same even if the second end-of-etch detector 103 is formed only on the side of the substrate in which the first end-of-etch detector 102 is formed, overlapping part or all of the first end-of-etch detector 102.

Figure 13A:
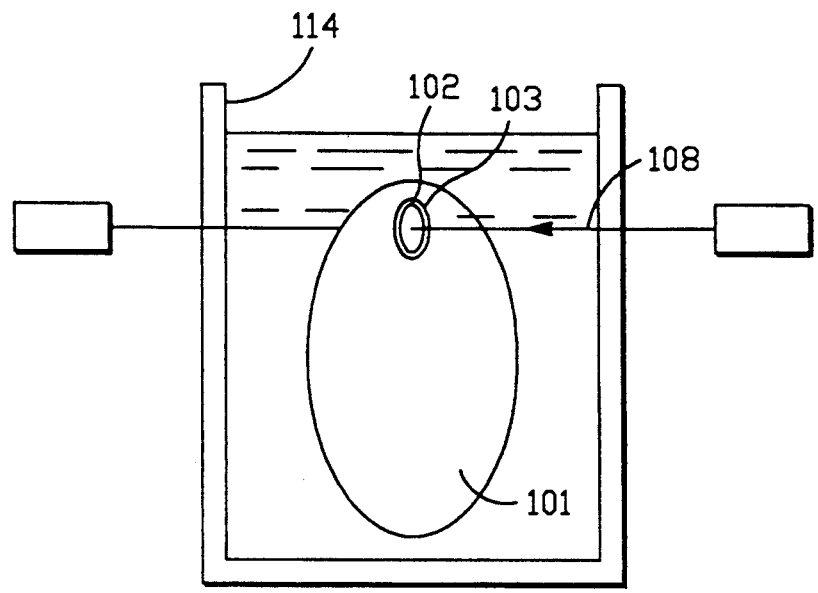
FIG. 13A diagrams a laser-based method of detecting the point to stop etching, and is a tenth embodiment of the present invention.
Figure 13B:
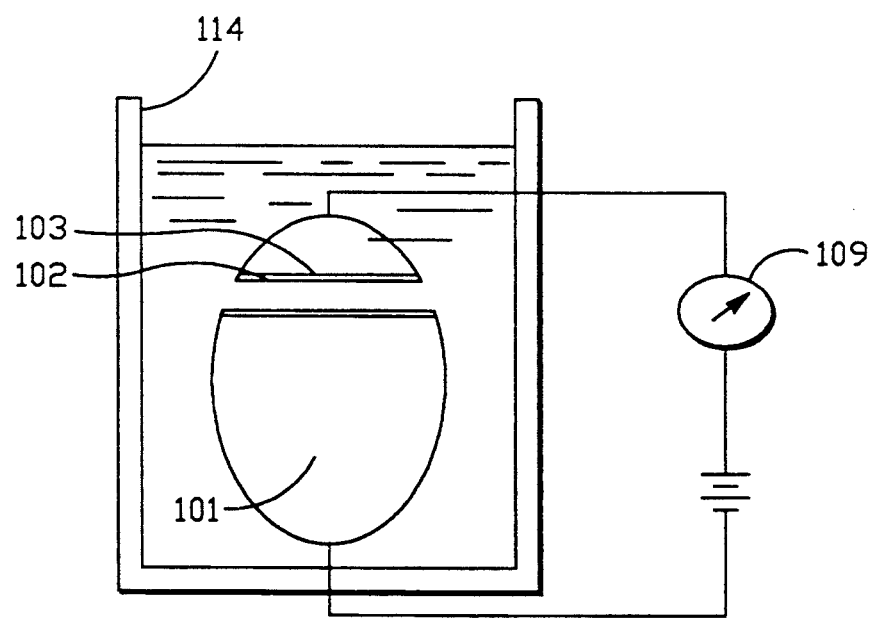
FIG. 13B diagrams a method of detecting the point to stop etching, and is an eleventh embodiment of the present invention.
Figure 13C:
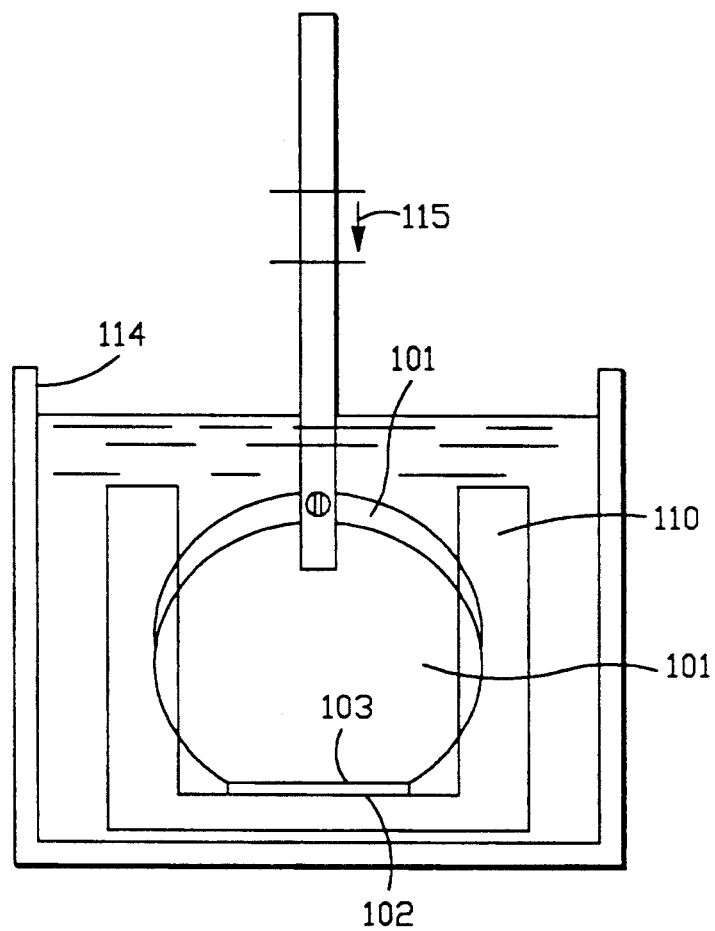
FIG. 13C diagrams an electrical method of detecting the point to stop etching, and is a twelfth embodiment of the present invention.

FIGS. 13A–13C show an alternative detection method, according tenth through twelfth embodiments of the present invention. In FIG. 13A, a laser beam 108 passes through a first detector 102' after the etching should be stopped. An etching tank 114 is preferably transparent and made of thick quartz glass (so the laser and a laser receiver can be located outside tank 114). It has been observed that, if etching tank 114 is made of sapphire, there is almost be no etching of tank 114 in a 30% KOH solution, even when the solution is heated to 60° C. FIG. 13B illustrates a detection method, according to the eleventh embodiment of the present invention. Silicon substrate 101 is placed in series with a current flow, and when the substrate 101 separates, current flow in the circuit drops substantially. So indirectly, the time to end etching will be indicated on a current meter 109. FIG. 13C illustrates the twelfth embodiment of the present invention. As before, silicon substrate 101 is cut in two at the same time that through-hole 105 opens up. If that edge of the silicon wafer had been supporting the weight, silicon substrate 101 drops a bit lower and a sort of dip-stick attached to it can be easily read outside the tank 114. Or, if converted to an electrical contact point, it can be detected electrically.

Again, if the thickness of silicon wafers 101 is the same, it is sufficient to control one substrate from a batch.

Figure 14A:
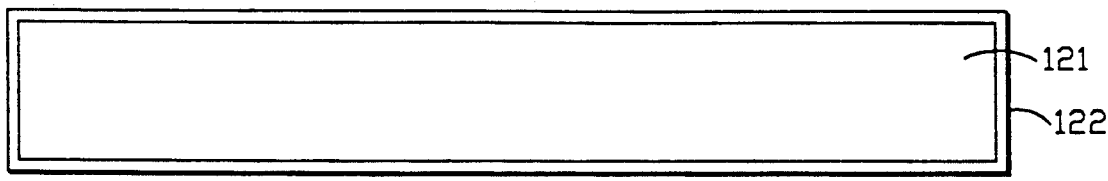
FIGS. 14A-14F are a sequence of cross-sectional views of a thirteenth embodiment of the present invention. The views correspond to several of the important stages of fabrication.
Figure 14B:
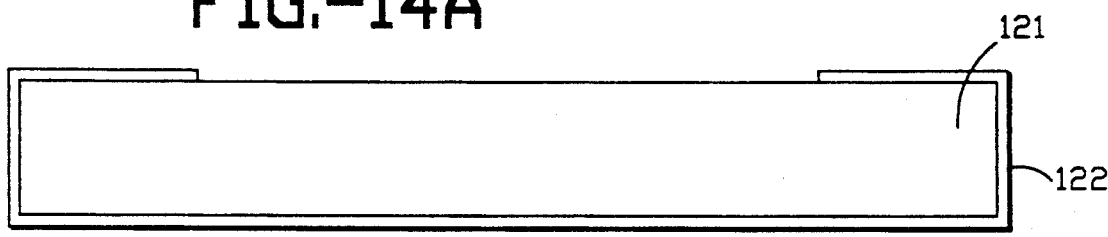
Figure 14C:
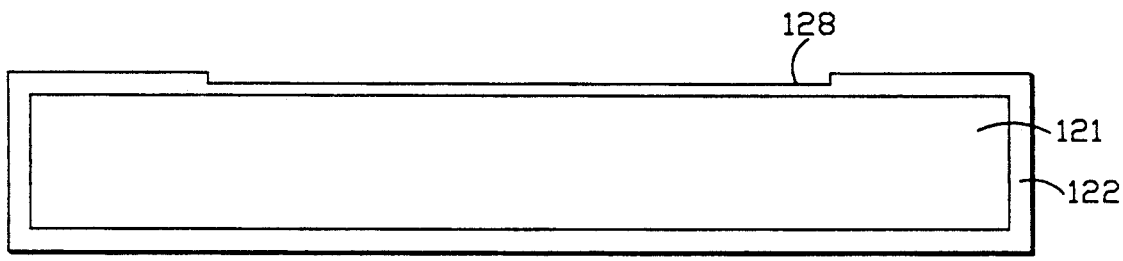

The variation in the diaphragms of the prior art was ±5 microns or more. However, the variation in the thickness of the diaphragms when actually produced using this embodiment was within a range of ±0.8 microns. As described in the foregoing, the thickness of the diaphragm can be fabricated accurately by etching the desired thickness of the diaphragm, by etching the first end-of-etch detector accurately at the same depth, and by detecting that the overlapping part of the first end-of-etch detector and the second end-of-etch detector has opened up. In addition, even if there is variation in the thickness of the silicon substrate, the diaphragm can be accurately fabricated using this method. Next, the processing of a silicon substrate for use in an ink jet printer head becomes an example to describe the silicon substrate processing of the present invention. FIG. 14 is an exemplary cross-section showing the silicon substrate production process of the present invention. As illustrated in FIG. 14F, the purpose of this process is to form flow channel 125 and ink nozzle 124 on the silicon substrate. Silicon substrate 121, which has a (100) crystal surface orientation and is 200 microns thick, is heated for 50 minutes at 1,000° C. in an oxygen atmosphere that includes steam, to form 0.4 micron oxide layer 122 (FIG. 14A). Oxide layer 122 undergoes pattern processing by means of photolithography and hydrofluoric acid etching to form ink flow channel 125 (FIG. 14B). Next, silicon substrate 121 is again heated in an oxygen atmosphere including steam for thermal oxidation. However, the process conditions are changed to 50 minutes at 900° C. This forms 0.2 micron thermal oxide layer 128 for the section corresponding to ink flow channel 125. The section that was 0.4 microns thick before the processing began now becomes 0.5 microns thick FIG. 14C).

Figure 14D:
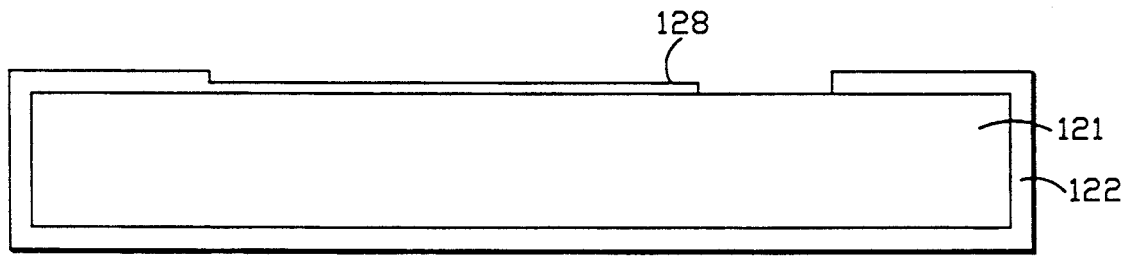

Next, the patterning process for forming thermal oxide layer 128 in ink nozzle 124 is done using photolithography and hydrofluoric acid etching (FIG. 14D). An alkaline solution is used to etch the silicon. In this embodiment, a KOH solution is used as the alkaline solution. (A KOH concentration of 25% percent by weight and a temperature of 80 degrees C.) Under these conditions, the silicon etching rate is one micron per minute. The thermal oxide layer etching rate is 0.002 microns per minute.

Figure 14E:
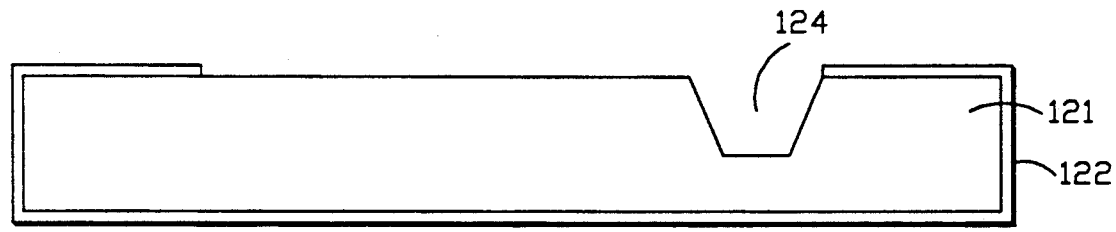
Figure 14F:
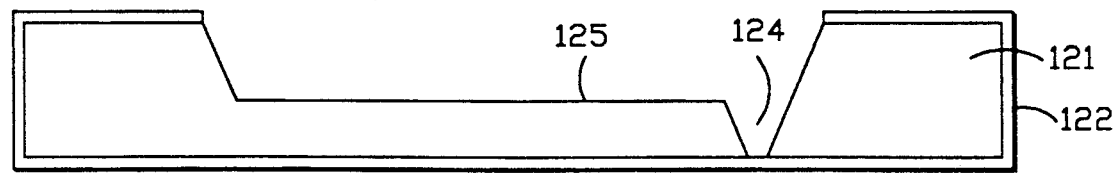
Figure 15A:
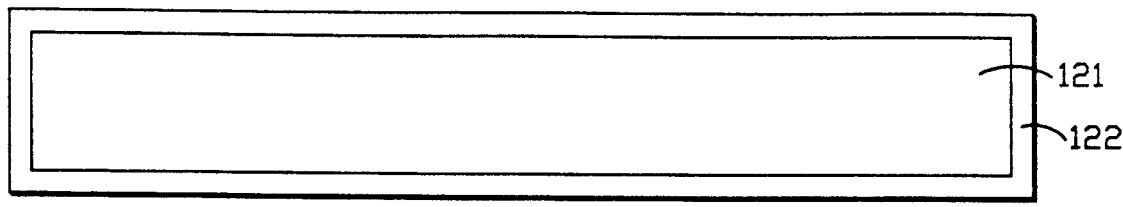
FIGS. 15A-15D are a sequence of cross-sectional views of a fourteenth embodiment of the present invention. The views correspond to several of the important stages of fabrication.
Figure 15B:
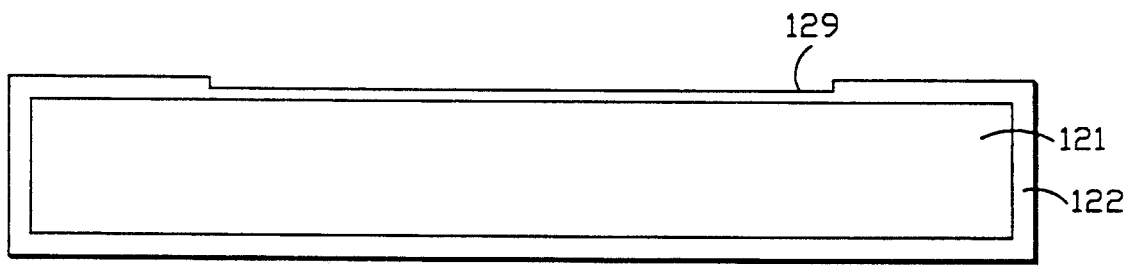
Figure 15C:
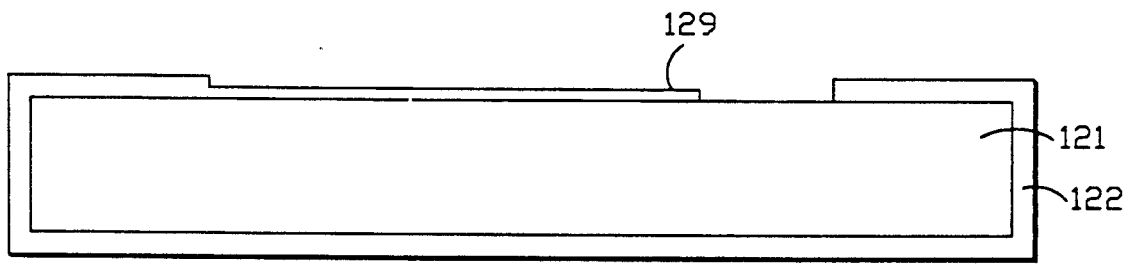
Figure 15D:
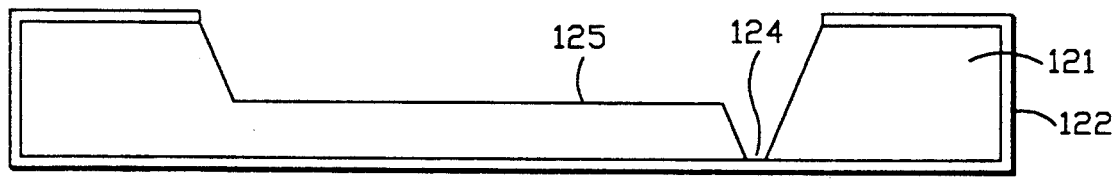
Figure 16:
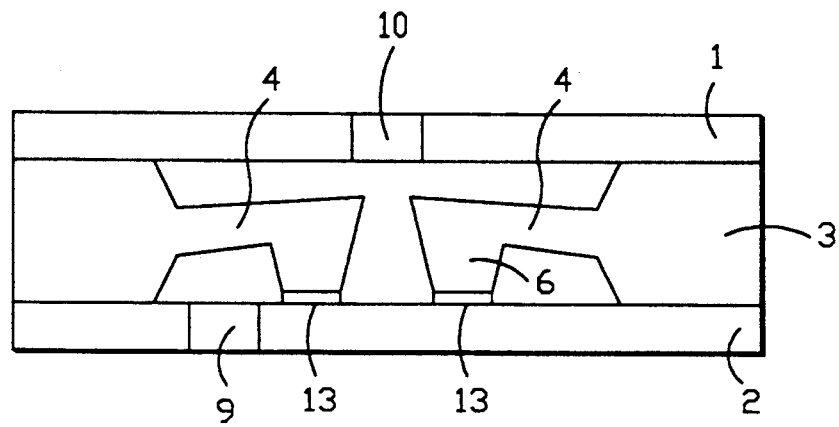
FIG. 16 is a cross-section that is the structure of the prior art diaphragm.
Figure 17:
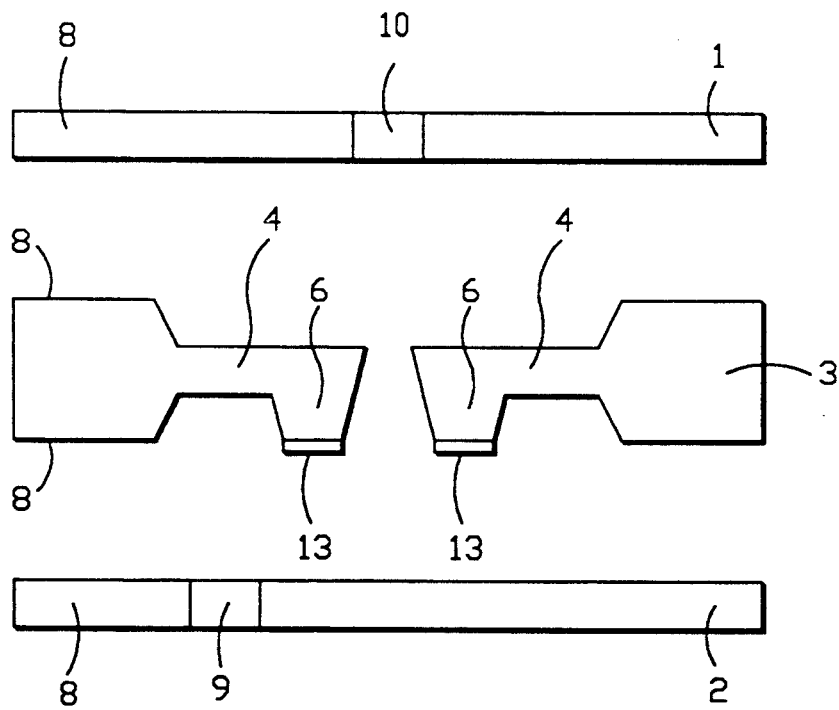
FIG. 17 is a cross-section of the components that show a prior art production process for the diaphragm of FIG. 16.
Figure 18A:
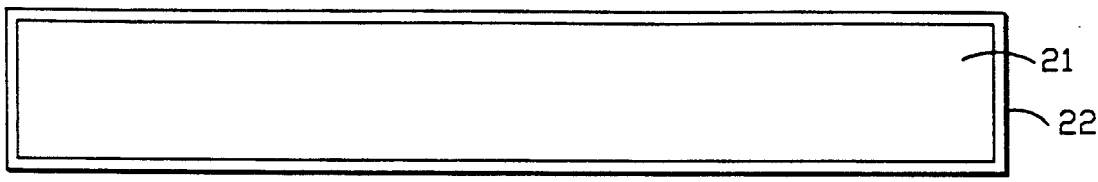
FIGS. 18A-18F shows cross-sections taken at various points in a prior production process to make an ink jet print head.
Figure 18B:
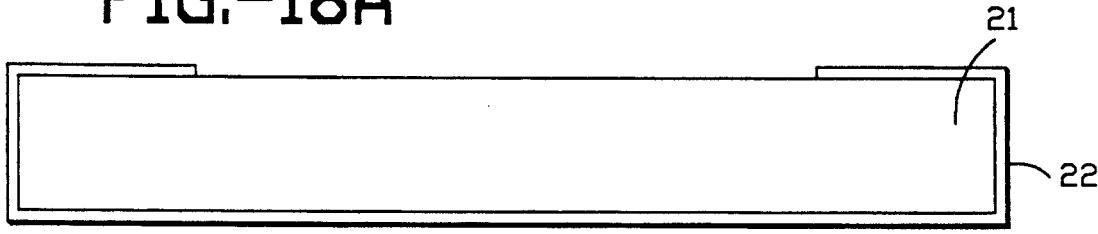
Figure 18C:
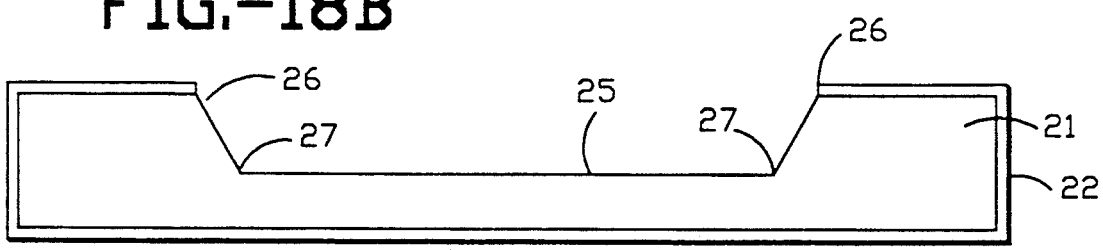
Figure 18D:
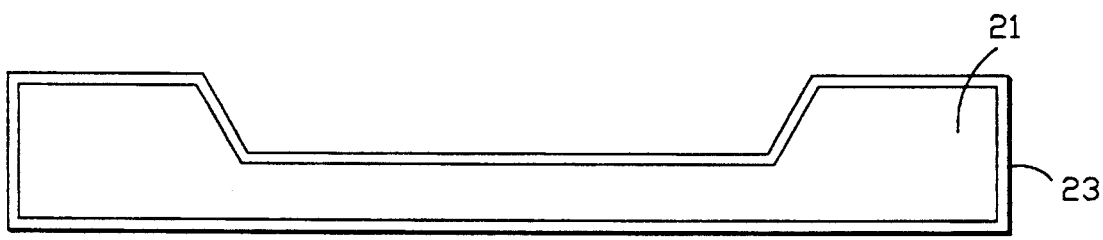
Figure 18E:
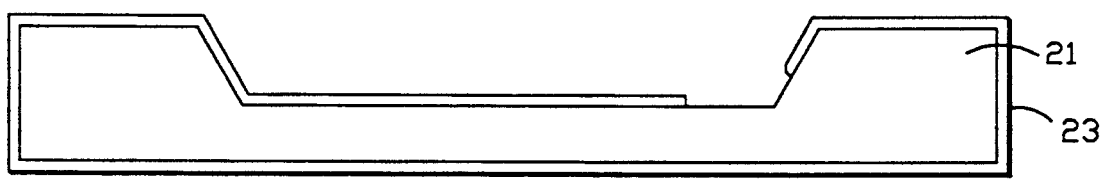
Figure 18F:
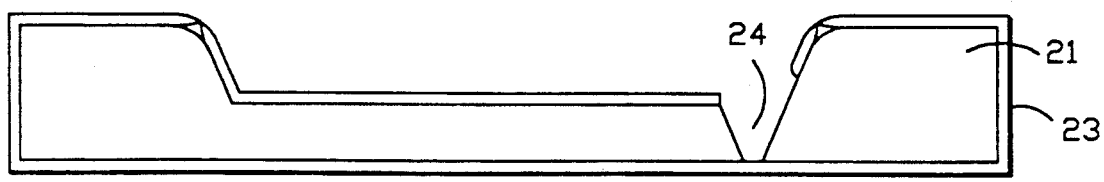

Silicon substrate 121 is etched for 200 minutes in the KOH solution. Due to the 200 minutes of etching, a 200 micron thick nozzle 124 opened up in silicon substrate 121. However, at 100 minutes after the etching begins, the 0.2 micron thick thermal oxide layer 128, which correspond to the ink flow channel 125, disappears, exposing the silicon substrate below it (FIG. 14E). However, 100 microns of this area will be etched away in the subsequent 100 minutes of etching (FIG. 14F). In other words, nozzle 124 and ink flow channel 125 of the ink jet printer head will be formed together in the production steps in FIGS. 14E and F.

Because this process does not photolithograph deeply contoured surfaces, as does the prior art, the patterning accuracy of the thermal oxide layer, as an etching photomask, is excellent. This results in better valve shapes.

FIG. 15 shows an example of an ink jet printer head. Silicon substrate 121, which has a (100) crystal surface orientation and is 200 microns thick, is heated for 70 minutes at 1,000° C. in an oxygen atmosphere that includes steam to form a 0.5 micron oxide layer 122 (FIG. 15A). By using photolithography and hydrofluoric acid etching, oxide layer 122 is used to form an ink channel 125. Next, 0.3 microns of film is etched away from oxide layer 122 etching half way through (FIG. 15B). Next, photolithography is used to form a photoresist pattern that is the shape of nozzle 124 on oxide layer 129. Oxide layer 129 is then etched using a hydrofluoric acid solution (FIG. 15C). An alkaline solution is used to etch away the silicon substrate (e.g., FIG. 14) to form nozzle 124 and ink channel 125.

As in the case of the first embodiment, this embodiment also does not use photolithography on deep surfaces (see, FIG. 18). Therefore, the etched shape of the silicon substrate is free of imperfections, allowing the desired, highly accurate shape to be obtained. The embodiments described above use the example of the processing of an ink jet printer head. However, the present invention is not limited to this. It is also effective in producing a variety of devices, such as micropumps or pressure sensors that include the alkaline anisotropic etching of the silicon substrate in their production processes.

While the present invention has been described in conjunction with several specific embodiments, it will be evident to those skilled in the art that many further alternatives, modifications and variations are possible, in light of the foregoing description. Thus, the present invention described herein is intended to embrace all such alternatives, modifications, applications and variations as may truly fall within the spirit and scope of the following claims.

What is claimed is:

1. A micropump formed in a silicon substrate sandwiched between two glass substrates, comprising:
   a diaphragm for pumping liquid;
   a flow channel;
   a valve, responsive to the diaphragm, for causing liquid to be pumped through the flow channel, the valve including a valve membrane; and
   a preloading layer deposited on the valve, such that contact between the preloading layer and one of the glass substrates tightens the seal of the valve, the preloading layer comprising a high-polymer material having at least one of polyimide and polyamide.

2. The micropump of claim 1, wherein:
the preloading layer is formed as a conical tip on the valve.

3. The micropump of claim 2, wherein:
the conical tip has a width $\leq 500$ microns and a height $\leq 5$ microns.

4. A micropump for pumping liquid from an entry channel to an exit channel, the micropump formed in a semiconductor substrate disposed between two sealing substrates such that first and second sides of the semiconductor substrate are in contact with the sealing substrates, the micropump comprising:
a first chamber;
valve means coupled between the entry channel and said first chamber, the valve means including a flexible valve membrane means positioned closer to the second side of the semiconductor substrate than to the first side of the semiconductor substrate for causing said valve means to be or not to be in contact with the sealing substrate contacting the second side of the semiconductor substrate for closing or opening said valve means;
a second chamber;
flow channel means coupled between said first chamber and said second chamber; and
diaphragm means forming part of a flexible wall of said second chamber and positioned closer to the second side of the semiconductor substrate than to the first side of the semiconductor substrate, said diaphragm responsive to external pressure for causing liquid to be pumped from the entry channel to the exit channel.

5. The micropump of claim 4, further comprising a preloading layer formed on said valve means for contacting with the sealing substrate contacting the second side of the semiconductor substrate.

6. The micropump of claim 5, wherein:
the preloading layer comprises a nitride layer.

7. The micropump of claim 5 wherein said preloading layer comprises polyimide.

8. The micropump of claim 5 wherein said preloading layer comprises polyamide.

9. The micropump of claim 5 wherein said preloading layer comprises a silicon dioxide.

10. The micropump of claim 5 wherein said preloading layer comprises a high-polymer material.

11. The micropump of claim 10, said preloading layer is formed as a conical tip on said valve means.

12. The micropump of claim 11, wherein the conical tip has a width $\leq 500$ microns and a height $\leq 5$ microns.

13. The micropump of claim 10 further comprising a piezoelectric flexor means mounted on said diaphragm means for causing said diaphragm means to vibrate to pump liquid.

14. A micropump for pumping liquid from an entry channel to an exit channel, the micropump formed in a semiconductor substrate disposed between two sealing substrates such that first and second sides of the semiconductor substrate are in contact with the sealing substrates, the micropump comprising:
a first chamber;
first valve means coupled between the entry channel and said first chamber, said first valve means including a flexible valve membrane means positioned closer to the second side of the semiconductor substrate than to the first side of the semiconductor substrate for causing said first valve means to be or not to be in contact with the sealing substrate contacting the second side of the semiconductor substrate for closing or opening said first valve means;
an second chamber;
a first flow channel coupled between said first chamber and said second chamber;
a third chamber;
a second flow channel coupled between said second chamber and said third chamber;
second valve means coupled between said third chamber and the exit channel, said second valve means including a flexible valve membrane means positioned closer to the second side of the semiconductor substrate than to the first side of the semiconductor substrate for causing said second valve means to be or not to be in contact with the sealing substrate contacting the second side of the semiconductor substrate for closing or opening said second valve means; and
diaphragm means forming part of a flexible wall of said second chamber and positioned closer to the second side of the semiconductor substrate than to the first side of the semiconductor substrate, said diaphragm means responsive to external pressure for causing liquid to be pumped from the entry channel to the exit channel.

15. The micropump of claim 14, further comprising a preloading layer formed on said first and second valve means for contacting with the sealing substrate contacting the second side of the semiconductor substrate.

16. The micropump of claim 15, wherein said preloading layer comprises polyimide.

17. The micropump of claim 15, wherein said preloading layer comprises polyamide.

18. The micropump of claim 15, wherein said preloading layer comprises a silicon dioxide.

19. The micropump of claim 15, wherein said preloading layer comprises a high-polymer material.

20. The micropump of claim 19, said preloading layer is formed as a conical tip on said first and valve means.

21. The micropump of claim 20 wherein the conical tip has a width $\leq 500$ microns and a height $\leq 5$ microns.

22. The micropump of claim 19 further comprising a piezoelectric flexor means mounted on said diaphragm means for causing said diaphragm means to vibrate to pump liquid.

* * * * *

UNITED STATES PATENT AND TRADEMARK OFFICE
CERTIFICATE OF CORRECTION

PATENT NO. : 5,259,737
DATED : November 9, 1993
INVENTOR(S) : Shinichi Kamisuki et al.

It is certified that error appears in the above-identified patent and that said Letters Patent is hereby corrected as shown below:

In the Abstract:

Line 21, change "may" to --any--.

Line 22, change "improve" to --improved--.

In the Claims:

Claim 14, line 18, change "an" to --a--.

Claim 20, Line 2, before "value" insert --second--.

Signed and Sealed this

Twenty-eight Day of March, 1995

*Attest:*

BRUCE LEHMAN

*Attesting Officer*     *Commissioner of Patents and Trademarks*